United States Patent
Fujiwara

(10) Patent No.: US 7,521,751 B2
(45) Date of Patent: Apr. 21, 2009

(54) NONVOLATILE MEMORY DEVICE

(75) Inventor: Ichiro Fujiwara, Kanagawa (JP)

(73) Assignee: Sony Corporation, Tokyo (JP)

( * ) Notice: Subject to any disclaimer, the term of this patent is extended or adjusted under 35 U.S.C. 154(b) by 502 days.

(21) Appl. No.: 11/229,409

(22) Filed: Sep. 16, 2005

(65) Prior Publication Data

US 2006/0065919 A1   Mar. 30, 2006

(30) Foreign Application Priority Data

Sep. 29, 2004 (JP) .......................... P2004-284037
Feb. 4, 2005 (JP) .......................... P2005-028909

(51) Int. Cl.
H01L 27/105 (2006.01)
(52) U.S. Cl. ................. 257/325; 257/324; 257/E21.662
(58) Field of Classification Search .................. 257/314, 257/324, 325
See application file for complete search history.

(56) References Cited

U.S. PATENT DOCUMENTS

| | | | |
|---|---|---|---|
| 6,274,901 B1 * | 8/2001 | Odake et al. ................. 257/315 |
| 6,414,346 B1 * | 7/2002 | Kanamori .................... 257/296 |
| 6,774,462 B2 * | 8/2004 | Tanaka et al. ............... 257/639 |
| 2006/0019502 A1 * | 1/2006 | Park et al. .................... 438/791 |
| 2006/0038218 A1 * | 2/2006 | Yaegashi et al. ............ 257/314 |

* cited by examiner

Primary Examiner—Jerome Jackson, Jr.
Assistant Examiner—Paul A Budd
(74) Attorney, Agent, or Firm—Robert J. Depke; Rockey, Depke & Lyons, LLC

(57) ABSTRACT

To provide a nonvolatile memory device suppressing a reduction of a data retention characteristic even if charges injected and stored into a local area of a nitride film is redistributed to achieve a reduction of voltage, the nonvolatile memory device in which hot electrons are injected into the local area of the nitride film at one or both of source•drain regions side to store data in a memory transistor is satisfied with a standard for evaluating a film quality of the nitride film, the standard being defined by one of the followings: a density of the bond group of silicon and hydrogen being under $1 \times 10^{21}$ cm$^{-3}$; an extinction coefficient in an ultraviolet region at a wavelength of 240 nm being under 0.10 or the extinction coefficient in 230 nm being under 0.14; an optical energy, a peak wavelength of an luminance spectrum, or a peak energy thereof.

17 Claims, 22 Drawing Sheets

WRITE DATA

ERASE DATA

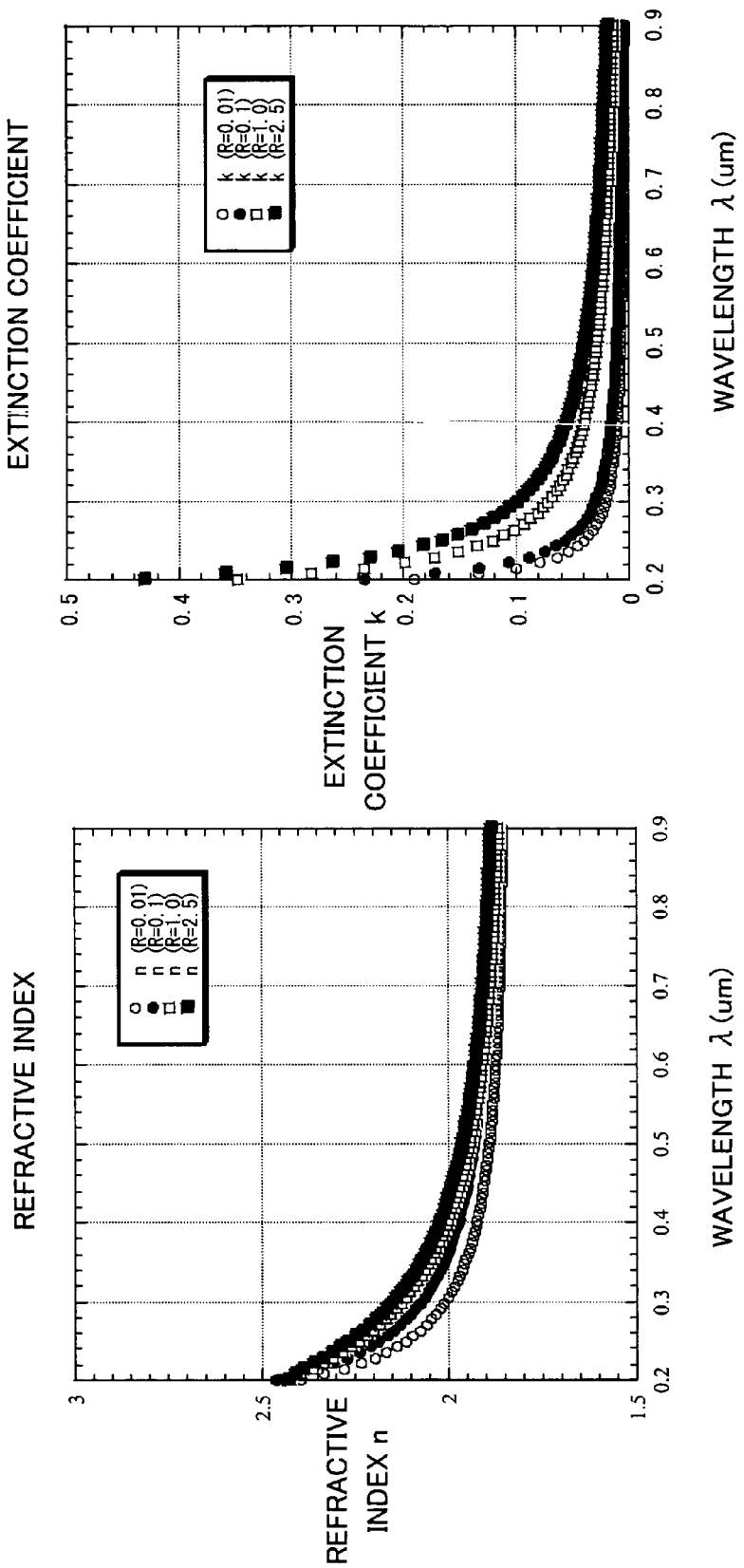

FIG. 23
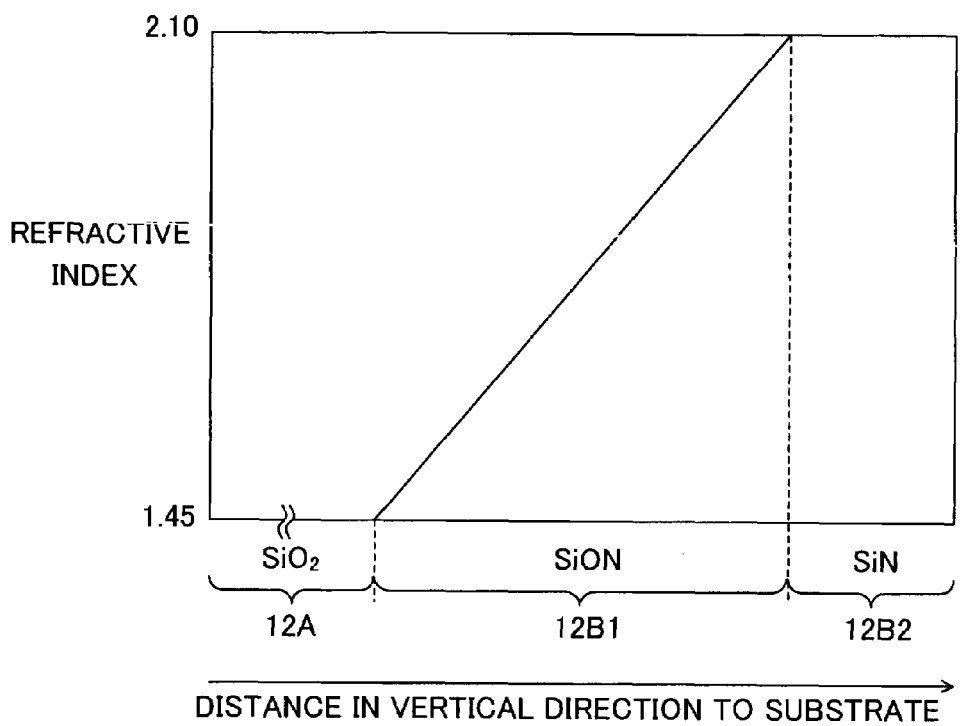
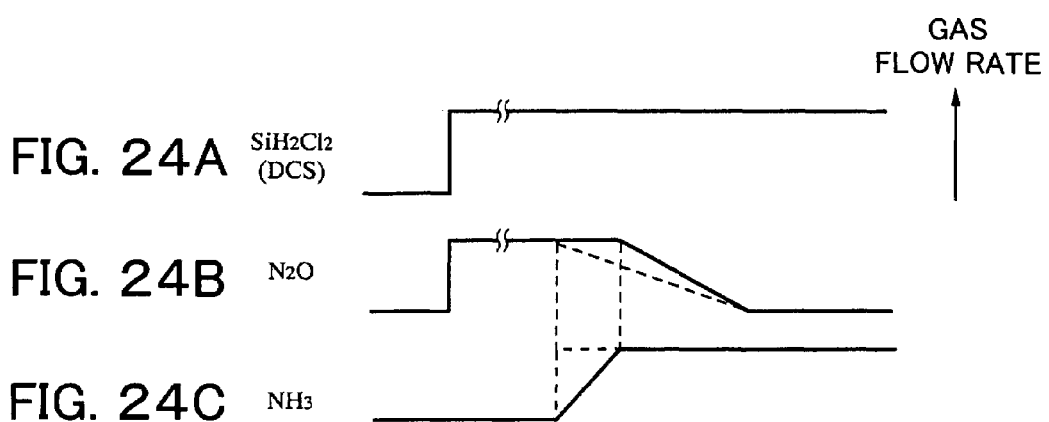
FIG. 24A SiH2Cl2 (DCS)
FIG. 24B N2O
FIG. 24C NH3

NONVOLATILE MEMORY DEVICE

CROSS REFERENCES TO RELATED APPLICATIONS

The present invention contains subject matter related to Japanese Patent Application JP 2004-284037 filed in the Japanese Patent Office on Sep. 29, 2004 and Japanese Patent Application JP 2005-28909 filed in the Japanese Patent Office on Feb. 4, 2005, the entire contents of which being incorporated herein by reference.

BACKGROUND OF THE INVENTION

1. Field of the Invention

The present invention relates to a nonvolatile memory device provided with a metal-oxide-nitride-oxide semiconductor (MONOS) type etc. memory transistor including a nitride film in a plurality of insulation films between a semiconductor region in which a channel is formed and a gate electrode, and injecting hot carriers (high energy charges) into charge traps in a local area in the vicinity of a boundary plane between the nitride film and other insulation film and in a bulk layer of the nitride film to store data, and a method of producing the same.

2. Description of the Related Art

Paying attention to that hot carriers can be injected into a part of dispersed traps by a so-called channel hot electron (CHE) injection method, there is known a technology in which binary data is respectively written in a source side and a drain side of a nitride film to allow a storage of two bits of data per a memory cell (for example, referred to "Extended Abstract of the 1999 International Conference on Solid State Devices and Materials, Tokyo, 1999, pp. 522-523").

In a description of the above document, a direction of applying a voltage between the source and the drain is changed, the two bits of data is written by the CHE injection, and a predetermined voltage is applied between the source and the drain in the reverse direction to a writing operation in a read operation, namely, a so-called "reverse read" method, which allows a read operation of the two bits of data accurately even if a writing time is short and an amount of retention charge is few. Also, an erase of data is performed by an injection of hot holes.

This technology can increase a speed for the writing time and reduce cost.

On the other hand, a nonvolatile memory injecting charges into a memory transistor to store data may be required to secure a difference of a threshold voltage (window width) in which at least a bit of data is able to discriminate after a retention of long duration at high temperature, so an improvement of the charge retention characteristics is important. In order to improve the charge retention characteristics, it may be required that a difference of initial threshold voltages is made large and that the threshold voltages hardly change in the retention of long duration at high temperature.

And additionally, it may be required that a speed for the writing and the erasing of data is made increase, operational voltages are made lower, and the feature thereof hardly change even if a rewriting of data is performed repeatedly (improvement of endurance characteristic).

SUMMARY OF THE INVENTION

The memory transistor described in the above document operates on the maximum voltage of 9 V, so a reduction of a voltage is not possible.

Along with the reduction of the voltage in recent days, it is limited to an increase of a difference of the initial threshold voltages. So, in order to secure the necessary data retention characteristic, it is important that the threshold voltages do not change in the retention of long duration at high temperature.

In the MONOS type nonvolatile memory using the CHE injection described in the above document, or other nonvolatile memories injecting hot carriers into the local area of the nitride film, it suffers from a disadvantage that a retained charge locally dispersed in the vicinity of the drain edge of the nitride film diffuses toward an area without a trapped charge after the retention of long duration at high temperature, and as a result, the threshold voltage drops and the data retention characteristic drops. So the difference of the initial threshold voltages may be required to be made large in advance corresponding to an existence of the written data. This becomes a factor preventing the nonvolatile memory injecting the hot carriers into the local area from lowering the voltage.

There is a need for, in the nonvolatile memory injecting the hot carriers into the local area of the nitride film to store data, overcoming a reduction of the data retention characteristic caused by a redistribution of the retained charge, which causes a difference of initial threshold voltages to make large in advance and suppresses a reduction of the voltage.

According to an embodiment of the present invention, there is provided a nonvolatile memory device having two source•drain regions formed in a semiconductor substrate and a plurality of insulation films including a nitride film for retaining charges inside and stacked between a gate electrode and a semiconductor region to be formed with a channel in a distance of the two source•drain regions in the respective memory transistors, and changing a charge storing state of the memory transistor by injecting hot carriers into a local area of the nitride film at one or both of the source•drain regions side, wherein a density of a bond group of silicon and hydrogen (Si—H bond) in the nitride film is not more than $1 \times 10^{21}$ cm$^{-3}$.

Preferably, a density of Si—H bond of the nitride film is $1 \times 10^{18}$ cm$^{-3}$ to $1 \times 10^{21}$ cm$^{-3}$.

Further, in the nitride film, an extinction coefficient which is an imaginary part of a complex refractive index in an ultraviolet region at a wavelength of 240 nm is not more than 0.10, or an extinction coefficient which is an imaginary part of a complex refractive index in an ultraviolet region at a wavelength of 230 nm is not more than 0.14.

In the nonvolatile memory device having the above configuration, when the density of Si—H bond of the nitride film is larger than $1 \times 10^{21}$ cm$^{-3}$, a fluctuation of the threshold voltage becomes sharply large. Therefore, in the present invention, the density of Si—H bond in the nitride film is not more than $1 \times 10^{21}$ cm$^{-3}$. In this way, the density of Si—H bond is defined, and depending on this, the charge trap density is decided. Then, the threshold voltage of the memory transistor is not change sharply after retaining it at high temperature for a long time in a condition that the charges having high energy is injected and retained into a local area of the nitride film.

According to an embodiment of the present invention, preferably, the nonvolatile memory device further has a voltage applying circuit of applying a plurality of voltages including a gate voltage and a drain voltage to the memory transistor so as to inject the hot carrier (high energy charge), the voltages satisfying any of three voltage conditions in which the maximum voltage is not more than 6 V, the gate voltage applied to the gate electrode is not more than the drain voltage applied between the two source•drain regions, and a difference of voltage of the gate voltage and a lower threshold voltage in two threshold voltages defining the data is not more than the drain voltage.

Generally, it is assumed that an operation is performed at a low voltage, for example, a control of a charge injection position is difficult in the nitride film in injecting an electron. And, in injecting holes to neutralize electrons electrically, a change of a distribution of the electrons due to thermal diffusion causes an insufficient neutralization, so data is liable to be retained at a state in which the electron and the hole are mixed together. In this case, a reduction of the threshold voltage which is hoped by a hole injection operation is not achieved, further there is a high possibility that the threshold voltage changes (decreases) due to the thermal distribution of the electron and the hole if retaining charge at high temperature for a long time after that.

In the present invention, even if the injected charges are retained at high temperature for a long time, the retention charge in the nitride film is hardly diffused due to a definition of the Si—H bond described above. Therefore, a writing operation of data and a erasing operation of data are performed certainly by injecting charges (for example, hole) having an opposed polarity to the retention charge (for example, electron), further, there is no change (reduction) of the threshold voltage due to the neutralization of the electron and the hole if retaining the charge at high temperature for a long time after that.

Specifically, a gate voltage in injecting the charge is indicated as Vg, the drain voltage is indicated as Vd, and the threshold voltage which is lower one of two threshold voltage defining a charge storing state is indicated as Vth1, further, in a plurality of the voltage supplied from the voltage applying circuit to the memory transistor, when any of three relationships of the maximum voltage of 6 V, Vg≦Vd, and Vg−Vth1≦Vd is satisfied, an impact ionization easily occurs to enable the charge to be injected in high efficiency. Note that, if a ratio of the impact ionization is high, the electron and additionally the hole may be easily injected. However, since the Si—H bond density is defined described above, the threshold voltage is not changed due to the retention at high temperature.

According to an embodiment of the present invention, there is provided a nonvolatile memory device having two source•drain regions formed in a semiconductor substrate and a plurality of insulation films including a nitride film for retaining charges inside thereof and stacked between a gate electrode and a semiconductor region to be formed with a channel in a distance of the two source•drain regions in the respective memory transistors, and changing a charge storing state of the memory transistor by injecting hot carriers (high energy charges) into a local area of the nitride film at one or both of the source•drain region side, wherein in the nitride film, an extinction coefficient which is an imaginary part of a complex refractive index in an ultraviolet region at a wavelength of 240 nm is not more than 0.10, or an extinction coefficient which is an imaginary part of a complex refractive index in an ultraviolet region at a wavelength of 230 nm is not more than 0.14.

In this embodiment, as a parameter enable to the measurement more directly related to the Si—H bond defined above, the extinction coefficient at the ultraviolet region of the nitride film is used. In this embodiment, in a plurality of the voltage supplied from the voltage applying circuit to the memory transistor, any of three relationships of the maximum voltage of 6 V, Vg≦Vd, and Vg−Vth1≦Vd is preferably satisfied.

Similarly to the above embodiment, in injecting the charge under these conditions, the electron and additionally the hole may be easily injected. Since the extinction coefficient at the ultraviolet region of the nitride film is defined as described above when the injected charge is retained at high temperature for a long time, the charge is hardly diffused. Therefore, in the memory transistor, the writing operation of data and the erasing operation of data are performed certainly and there is no reduction of the threshold voltage caused by the neutralization of the electron and the hole.

According to an embodiment of the present invention, there is provided a nonvolatile memory device having two source•drain regions formed in a semiconductor substrate and a plurality of insulation films including a nitride film for retaining charges inside thereof and stacked between a gate electrode and a semiconductor region to be formed with a channel in a distance of the two source•drain regions in the respective memory transistors, and changing a charge storing state of the memory transistor by injecting hot carriers into a local area of the nitride film at one or both of the source•drain region side, wherein an optical bandgap of the nitride film is not less than 5.15 eV.

In the nonvolatile memory device having such configuration, the optical bandgap of the nitride film being larger than 5.15 eV causes the threshold voltage to change sharply. Therefore, in this embodiment, the optical bandgap of the nitride film is not less than 5.15 eV. The optical bandgap is defined as described above, the charge trap density is defined depending on this. In this case, the threshold voltage of the memory transistor does not change drastically after retaining the charge at high temperature for a long time at a state in which the charges having high energy are injected and retained into a local area of the nitride film.

In this embodiment, in a plurality of voltages supplied from the voltage applying circuit, any of three relationships of the maximum voltage thereof of 6 V, Vg≦Vd, and Vg−Vth1≦Vd is preferably satisfied.

Similarly to the above embodiment, in injecting the charge under these conditions, the electron and additionally the hole may be easily injected. Since the optical bandgap of the nitride film is defined as described above when the injected charge is retained at high temperature for a long time, the charge is hardly diffused. Therefore, in the memory transistor, the writing operation of data and the erasing operation of data are performed certainly and there is no reduction of the threshold voltage caused by the neutralization of the electron and the hole.

According to an embodiment of the present invention, there is provided a nonvolatile memory device having two source•drain regions formed in a semiconductor substrate and a plurality of insulation films including a nitride film retaining charges inside thereof and stacked between a gate electrode and a semiconductor region formed with a channel in a distance of the two source•drain regions in the respective memory transistors, and changing a charge storing state of the memory transistor by injecting hot carriers into a local area of the nitride film at one or both of the source•drain region side, wherein a peak wavelength of a luminance spectrum of the nitride film is not more than 500 nm, or an energy of the luminance spectrum thereof is not less than 2.5 eV.

In this embodiment, as a parameter enable to the measurement more directly related to the optical bandgap defined above, the peak of the luminance spectrum of the nitride film is used. In this embodiment, in a plurality of the voltage supplied from the voltage applying circuit to the memory transistor, any of three relationships of the maximum voltage of 6 V, Vg≦Vd, and Vg−Vth1≦Vd is preferably satisfied.

Similarly to the above embodiment, in injecting the charge under these conditions, the electron and additionally the hole may be easily injected. Since the peak energy or the luminance spectrum of the nitride film is defined as described above when the injected charge is retained at high temperature for a long time, the charge is hardly diffused. Therefore, in the memory transistor, the writing operation of data and the erasing operation of data are performed certainly and there is no reduction of the threshold voltage caused by the neutralization of the electron and the hole.

According to an embodiment of the present invention, there is provided a method of producing a nonvolatile memory device having two source•drain regions formed in a semiconductor substrate and a plurality of insulation films including a nitride film retaining charges inside thereof and stacked between a gate electrode and a semiconductor region to be formed with a channel in a distance of the two source•drain regions in the respective memory transistors, the method having the steps of: measuring a density of a bond group of silicon and hydrogen (Si—H bond) in the nitride film or an extinction coefficient of the nitride film; determining a formation condition based on the density of Si—H bond or the extinction coefficient; and forming the nitride film under the formation condition.

Preferably, in determining the formation condition, a standard of the density of Si—H bond is not more than $1 \times 10^{21}$ $cm^{-3}$.

According to an embodiment of the present invention, there is provided a method of producing a nonvolatile memory device having two source•drain regions formed in a semiconductor substrate and a plurality of insulation films including a nitride film retaining charges inside thereof and stacked between a gate electrode and a semiconductor region formed with a channel in a distance of the two source•drain regions in the respective memory transistors, the method having the steps of: measuring an optical bandgap of the nitride film or a peak wavelength of a luminance spectrum thereof, and determining a formation condition based on the optical bandgap or the peak wavelength of the luminance spectrum.

Preferably, in determining the formation condition, a standard of the optical bandgap is not less than 5.15 eV.

Preferably, in determining the formation condition, a standard of the peak wavelength of the luminance spectrum is not more than 500 nm.

According to a nonvolatile memory device of an embodiment of the present invention, an upper limit of the Si—H bond density in the nitride film is defined, and then the charge trap density (or the extinction coefficient at the ultraviolet region of the nitride film) is defined. As a result, the threshold voltage of the memory transistor does not change drastically after retaining the charge at high temperature for a long time. Consequently, there are advantages that the data retention characteristic is good and a difference of the initial threshold voltages can be made small to reduce the voltage.

According to a nonvolatile memory device of an embodiment of the present invention, a lower limit of the optical bandgap (or an upper limit of the peak wavelength or a lower limit of the peak energy in the luminance spectrum of the nitride film) in the nitride film is defined. As a result, the threshold voltage of the memory transistor does not change drastically after retaining the charge at high temperature for a long time. Consequently, there are advantages that the data retention characteristic is good and a difference of the initial threshold voltages can be made small to reduce the voltage.

According to a nonvolatile memory device of an embodiment of the present invention, by using a measured result of the extinction coefficient, which is an imaginary number portion of a complex refractive index, which is easier than a measurement of the Si—H bond density, there is an advantage that a determination of a formation condition for defining the Si—H bond density in the nitride film within a predetermined range is performed accurately.

According to a nonvolatile memory device of an embodiment of the present invention, by using a measured result of the optical bandgap or peak wavelength of the luminance spectrum, there is an advantage that a determination of a formation condition for defining the Si—H bond density in the nitride film within a predetermined range is performed accurately.

BRIEF DESCRIPTION OF THE DRAWINGS

These features of embodiments of the present invention will be described in more detail with reference to the accompanying drawings, in which:

FIG. 8B is a graph in which FIG. 8A is expressed again by indicating a difference of the threshold voltage at ordinate;

FIG. 9A is a graph of a wavelength dependent of a refractive index at an ultraviolet absorption edge by using the flow rate as a parameter, and FIG. 9B is a graph of a wavelength dependent of an extinction coefficient by using the flow rate as a parameter, both concerning a second embodiment;

FIG. 23 is a graph showing a change of a refractive index in a structure transition layer; and FIG. 24 is a view showing an example of gas injection timing.

DESCRIPTION OF THE PREFERRED EMBODIMENTS

Hereinafter, preferred embodiments of the present invention will be described as an example of the case having an N channel type memory transistor with reference to the drawings. Note that, in the case of having a P-channel type memory transistor, conductive types of impurity regions are reversed and some of polarities of applied voltages is reversed and operated, so below descriptions can be applied.

First Embodiment

Figure 1:
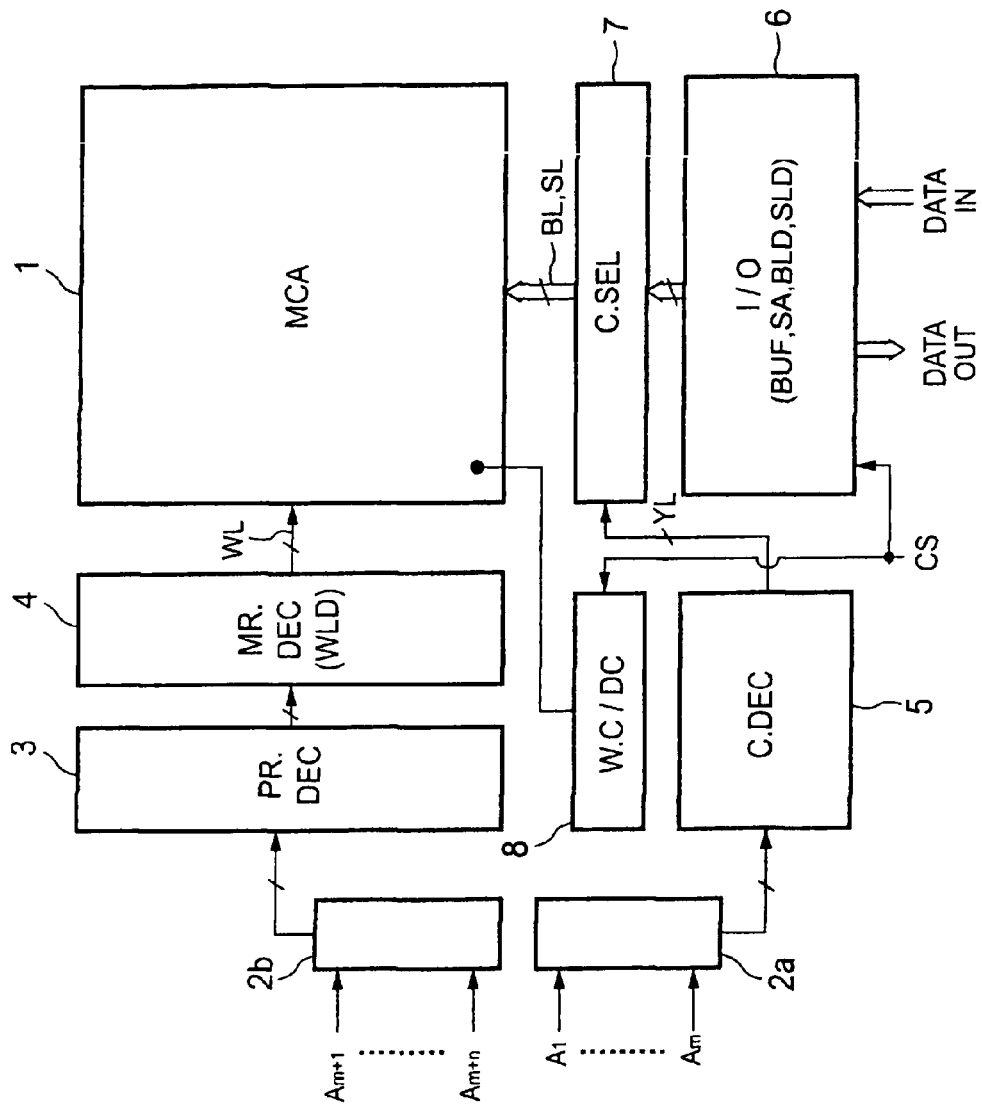
FIG. 1 is a block diagram of a schematic configuration of a nonvolatile memory device according to a present embodiment.

FIG. 1 is a view of a schematic configuration of a nonvolatile memory device.

The nonvolatile memory device illustrated in FIG. 1 includes a memory cell array (MCA) 1 having memory transistors arranged in matrix and a memory peripheral circuit for controlling an operation of the memory cell array 1.

The memory peripheral circuit has a column buffer 2a, a row buffer 2b, a pre-row decoder (PR.DEC) 3, a main-row decoder (MR.DEC) 4, a column decoder (C.DEC) 5, an input and output circuit (I/O) 6, a column selective gate array (C.SEL) 7, and a well charge and discharge circuit (W.C/DC) 8. Note that, in the case of not performing well bias, the well charge and discharge circuit 8 can be omitted. The memory peripheral circuit, not illustrated in the drawing, includes a power source circuit boosting somewhat a power source voltage if necessary and supplying the boosted voltage to the main-row decoder 4 or the well charge and discharge circuit 8, and a control circuit for controlling the above respective units. The memory peripheral circuit has a function of a "voltage supplying circuit" according to the present invention.

In the present embodiment, the power source voltage supplied from the memory peripheral circuit to the memory cell array 1 is a single power source voltage, and it is not more than 6 V in the maximum value, more preferably not more than 5 V. This is because, as mentioned later, an improvement of the data retention characteristic in the memory transistor allows the voltage make lower. Therefore, a withstand voltage specified for transistor in the memory peripheral circuit is approximately 5 to 6 V, which is similarly to that for a transistor in the general logic circuit, for example, in an input and output stage. Namely, in the case of embedding the configuration shown in FIG. 1 in an integration circuit with the logic circuit, a high-withstand voltage transistor is not included, so a commonality in processes can be improved extremely.

Note that, a basic operation of the respective portions in the memory peripheral circuit is the same as the general nonvolatile memory device, and the description thereof is omitted.

Figure 2:
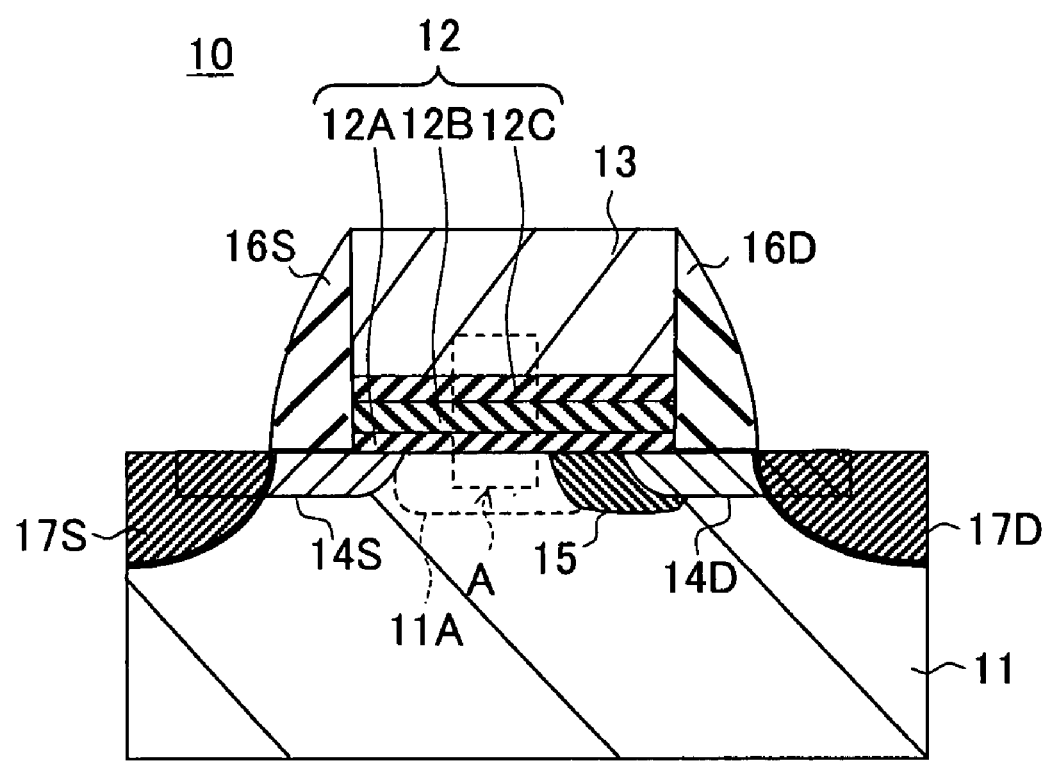
FIG. 2 is a cross-sectional view of a MONOS type memory transistor.

FIG. 2 is a cross sectional view of a MONOS type memory transistor.

In a memory transistor 10 shown in FIG. 2, a part of a semiconductor substrate or a well made of p-type semiconductor is a semiconductor region in which a channel is formed, namely, an active region 11A. Here, the active region 11A is appeared in concrete form of a part of a p-type semiconductor substrate, a p-type well formed via other well in the substrate if necessary, or a p-type semiconductor layer supported by a substrate, for example, a silicon-on-insulator (SOI) layer.

A stacked insulation film 12 made of a first oxidation film 12A, a nitride layer 12B as a charge storage layer, and a second oxidation film 12C is formed on a surface of the active region 11A, and a gate electrode 13 is formed on the stacked layer 12. Note that, usually, the first oxidation film 12A is referred to a bottom oxidation film and the second oxidation film 12C is referred to a top oxidation film.

The nitride film 12B is made of a material having a charge trap density higher than that of the first and the second oxidation films 12A and 12C, and functions as the charge storage layer in injecting charges. Note that, strictly, the charge may be captured in the first and the second oxidation films 12A and 12C, but the absolute amount thereof is extremely fewer than the nitride film 12B, consequently the nitride film 12B is referred to the charge storage layer.

The first and the second oxidation films 12A and 12C electrically separate the nitride film 12B from the active region 11A or the gate electrode 13, and make the charges confined in the nitride film 12B. The first and the second oxidation films 12A and 12C can be replaced by other films having a sufficient difference of a charge trap density against the nitride film 12B and functioning as a potential barrier, for example, by an oxynitride film.

Two N-type lightly doped drain (LDD) regions 14S and 14D overlapping the gate electrode 13 are separated and formed in the active region 11A respectively. Also, a pocket region 15 made of a P-type impurity region is formed to extend from in the vicinity of an edge portion of the LDD region 14D of the drain side toward the source side. The pocket region 15 is formed by injecting P-type impurities by a tilt ion implantation. A dose of the ion implantation at this time is optimized, finally, the concentration of the P-type impurity in the pocket region 15 is adjusted to be enough higher than that of the active region 11A. If such pocket region exists, the concentration of the P-type impurity may be locally high at an edge portion of the LDD region 14D of the drain side, so an extension of a depletion layer may be suppressed at this portion, as a result, an electric field may be concentrated in a horizontal direction.

This provides an improvement of charge injection efficiency, so the formation of the pocket region 15 is preferably. But the formation of the pocket region 15 is not necessary in the present invention, so it can be omitted. Note that, in the MONOS type transistor having not more than 6 V in the operation voltage such as the present embodiment, one of characteristics thereof is that the concentration of the pocket region 15 is higher than a channel hot electron (CHE) injection type MONOS type transistor in related art.

Spacers 16S and 16D made of insulator are formed at both sidewalls of the gate electrode 13. A source region 17S made of an N-type impurity region is formed in a surface side portion of the active region 11A which position is defined by the spacer 16S, and similarly, a drain region 17D made of the N-type impurity region is formed in the surface side portion of the active region 11A which position is defined by the spacer 16D.

The source region 17S and the drain region 17D are formed by performing an ion implantation of N-type impurities with respectively high concentration. At this time, the spacers 16S and 16D and the gate electrode 13 function as a self alignment mask, so the positions of the source region 17S and the drain region 17D are determined. The LDD regions 14S and 14D are formed by performing the ion implantation of N-type impurities before the formation of the spacers 16S and 16D, and the concentration thereof is generally set lower than those of the source region 17S and the drain region 17D. Additionally, the respective patterns of the LDD regions 14S and 14D overlap the pattern edge portions of the gate electrode 13. Due to this, in the case of injecting holes, the field of the gate may easily affect the drain and a generation of the hole is possible by the low drain voltage.

Note that, in order that the field of the gate easily affects the drain, the LDD region 14D may be extended at a portion directly under the edge portion of the gate electrode from the drain region 17D. In such meaning, the LDD region 14D may be referred to an "extension region" which is not indicating a magnitude relation of that concentration. In this case, a concentration of an N-type impurity in the extension region may not lower than that of the drain region 17D.

The source region 17S, the drain region 17D, the gate region 13, and the active region 11A can respectively apply a voltage Vs (source voltage), Vd (drain voltage), and Vg (gate voltage), which are adopted to the respective operations, and if necessary Vb (back-bias voltage) via a contact portion and a wiring not shown in the drawings.

A number of memory transistors 10 having such configurations are arranged in matrix to form the memory cell array (MCA) 1 of the nonvolatile memory device (referred to FIG. 1).

In the respective memory transistor 10, the nitride film 12B serving as the charge storage layer has a high charge trap density in the vicinity of a boundary portion of the second oxidation film 12C. In comparison with a state where electrons are injected and captured into charge traps in the vicinity of the boundary portion or charge traps of a bulk layer of the nitride film 12B and a state where the captured electrons are erased, the threshold voltage of the memory transistor 10 differs. Therefore, the difference of the threshold voltages is corresponded to a binary state of data, so the data can be stored in the memory transistor 10. Note that, the binary or multilevel storage data could be read out if difference of the threshold voltages is detected, so, how state it assumes as a writing state and how state it assumes as a erasing state depend on a definition.

Hereinafter, an example of a configuration of the memory cell array and an example of an operation of the memory transistor will be described.

Figure 3A:
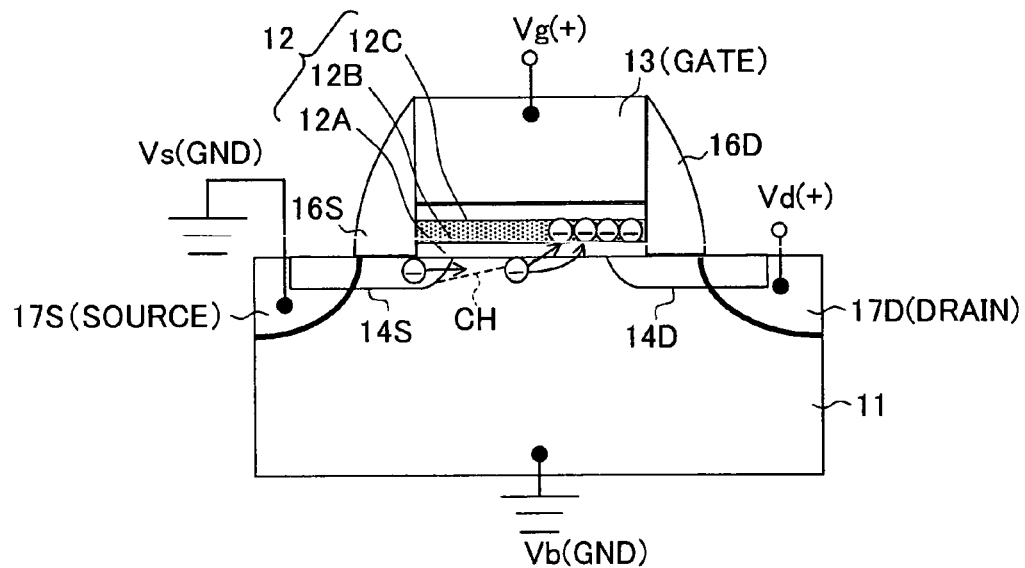
FIG. 3A is a view for explaining a writing operation and FIG. 3B is a view for explaining an erasing operation.
Figure 3B:
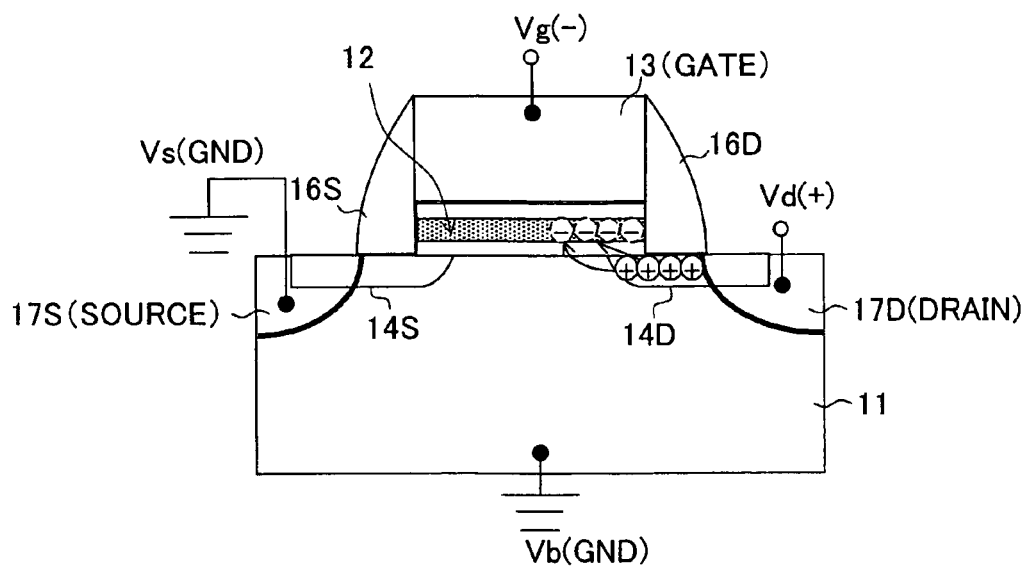
Figure 4:
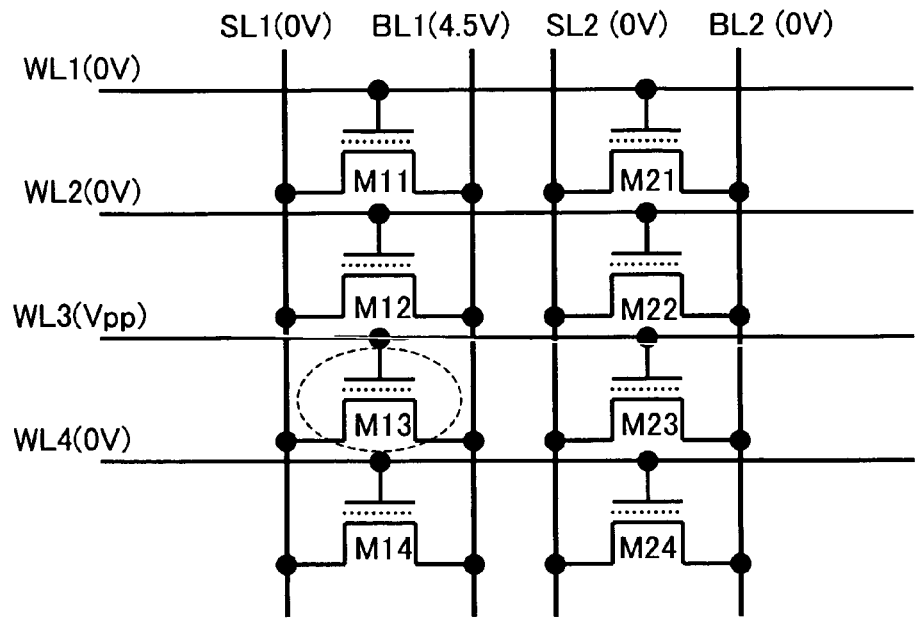
FIG. 4 is a circuit diagram of a part of a memory cell array showing an example of a bias setting in an operation.
Figure 5:
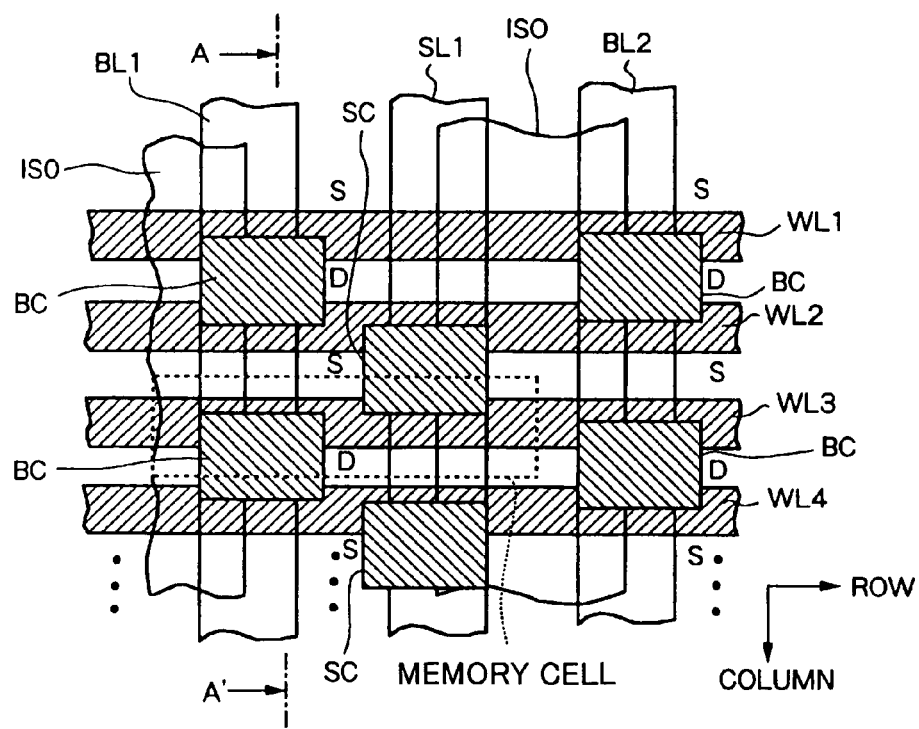
FIG. 5 is a schematic plan view of a memory cell array region corresponding to the equivalent circuit diagram shown in FIG. 4.

FIG. 3 is a view explaining the operation in writing and erasing data, FIG. 4 is an equivalent circuit diagram of a part of the memory cell array showing an example of a bias setting in the operations, and FIG. 5 is a schematic plan view of a memory cell array region corresponding to the equivalent circuit diagram shown in FIG. 4. Note that, the array configuration shown in FIG. 4 does not limit a configuration of the memory cell array (MCA) 1 and any array configuration can be applied in the present invention basically.

First, an example of a configuration of the memory cell array will be described with reference to FIG. 4 and FIG. 5.

In an example of the memory cell array shown in FIG. 4, memory transistors M11 to M24 which functions as the memory cells are arranged in matrix, and those transistors are respectively wired by a word line, a bit line, and a separated source line.

Drains of the memory transistors M11, M12, M13 and M14 arranged in a column direction are connected to a bit line BL1, and sources thereof are connected to the source line SL1. Also, drains of the memory transistors M21, M22, M23, and M24 arranged in the column direction are connected to a bit line BL2, and sources thereof are connected to a source line SL2.

Gates of the memory transistors M11 and M21 adjoining in a row direction are connected to a word line WL1. Similarly, gates of the memory transistors M12 and M22 adjoining in the row direction are connected to a word line WL2, gates of the memory transistors M13 and M23 adjoining in the row direction are connected to a word line WL3, and gates of the memory transistors M14 and M24 adjoining in the row direction are connected to a word line WL4.

In the entire memory cell array, a cell arrangement and an inter-cell connection illustrated in FIG. 4 are repeated.

In FIG. 5, a self alignment contact portion (not shown) is opened between the adjoined two word lines and along with the word lines, and conductive material is buried alternately into the self alignment contact portion to overlap a source region S or a drain region D. Consequently, a bit contact plug BC and a source contact plug SC are formed. The bit contact plug BC overlaps one edge portion of the row direction of the drain region D. And the source contact plug SC overlaps the other edge portion of the row direction of the source region S. As a result, the bit contact plug BC and the source contact plug SC are formed alternately as shown in FIG. 5.

A recess portion surroundings the contact is buried by an insulation film not shown in the drawing. On the insulation film, the bit lines BL1, BL2, . . . contacted on the bit contact plug BC and the source line SL contacted on the source contact plug SC are formed alternately. The bit lines and source lines have a parallel line shape long in the column direction.

In a high density NOR type cell array, the formation of the contact for the bit line or the source line is achieved by the formation of the self alignment contact portion and the formation of the bit contact plug BC and the source contact plug SC.

In the formation process for the self alignment contact portion, an offset insulation film is formed on a conductive layer to be the word line and is etched together to form a pattern for the word line, then, a insulation film is formed and an entire surface is etched (etch-back). As a result, side-wall insulation layers are formed at both sides of the word line and the offset insulation layer in a width direction, and the self alignment contact portion is formed between the word lines. Due to the formation of the self alignment contact portion, the surrounding of the word line is covered by insulation films and an exposed surface of the source region S or the drain region D is uniformity formed in the self alignment contact portion.

The formation of the bit contact plug BC and the source contact plug SC is achieved by burying a conductive layer into an inside of the self alignment contact portion and separating the conductive layer at a predetermined interval. As a result, the bit contact plug BC contacting with the exposed surface of the source region S and the source contact plug SC contacting with the exposed surface of the drain region D are formed together.

In the array configuration, since a size of the contacting surface of the respective plugs in the column direction is determined by a width of the self alignment contact portion, the contacting surface of the respective plugs has a small fluctuation of a contact area. An insulation between the bit contact plug BC or the source contact plug SC and the word line is easily separated. The bit contact plug BC and the source contact plug SC, and the bit line and the source line are formed by patterning the same hierarchical insulation film respectively. Therefore, the wiring configuration is extremely simple, process steps are few, and the configuration has an advantage for keeping low cost in the production.

Also, the each memory transistor has a configuration directly connecting the bit contact plug BC and the source contact plug SC to the bit line or the separated source line respectively. This enables a parasitic resistance to make few, the read out current to increase, and a reading out speed to increase.

Next, an example of an operation of the memory transistor will be described.

This example is assumed that a data write operation is performed by injecting hot carriers (high energy charges) locally, and the case using the hot electron (HE) injection will be described. Note that, as the injection method for the hot carrier other than the above, the channel hot electron (CHE) method, an HE injection method using a drain avalanche phenomenon caused by an impact ionization, and an HE injection method using a band-to-band tunneling phenomenon are applicable. Also, the erasing method is not limited to FIG. 3, so a method of drawing out a charge by a FN tunneling is also applicable.

In the case of a write operation by using the HE injection, the memory transistor M13 to be written surrounded by a broken line in FIG. 4, as shown in FIG. 3A and FIG. 4, by using a substrate potential Vb as a reference, applies 0 V via the source line SL1 to the source region 17S, applies a drain voltage Vd(+), for example, 4.5 V, via the bit line BL1 to the drain region 17D, and applies a positive program voltage Vpp (in FIG. 3A, indicate Vg(+)), for example, 5 V to the word line WL3. The other source line SL2, the other bit line BL2, and other word lines WL1, WL2, and WL4 shown in FIG. 4 are retained at 0 V.

Under the bias condition, electrons supplied from the source region 17S side shown in FIG. 3A are accelerated in the formed channel CH to become hot carriers (in this case, hot electron HE). A part of them is captured at a region which is mainly the nitride film 12B of the stacked insulation film 12 in the drain side, and stored locally. Once stored the electron is not moved by somewhat thermal treatment if the charge trap density is not high excessively, and can be retained with a distribution profile right after the injection. Therefore, a storage range for the electron can be limit to a local area, which achieves a record for one bit of data.

Further, a voltage relationship between the source and the drain is reversed and the HE injection is performed again. Consequently, the source region 17S and the extension region 14S shown in FIG. 3A function as the drain and another one bit of data is stored at a local area opposed side to the nitride film 12B.

Other memory cells shown in FIG. 4 stores two bits of data respectively by the similar method.

In a case where a read operation for binary data is performed in a word line unit, by using the substrate potential Vb as a reference, the drain voltage of 0 V is applied to the bit lines BL1 and BL2, and the drain voltage, for example, 0.5 to 1.0 V is applied to the source lines SL1 and SL2. And the gate voltage, for example, 3 V is applied to the word line WL3. A memory transistor changes its threshold voltage depending on an existence of charges mainly stored in the source side. Therefore, a read out current flows in the channel CH or the amount of the read out current is determined depending on the existence of the charges at the drain region 17D side shown in FIG. 3A or the amount of the stored charges. When the source line or the bit line is set in a floating state just before the read out current flows, a potential change occurs at the source line or the bit line which is in the floating state. The potential change of the source line or the bit line is amplified by a sense amplifier, which makes it possible to read out the binary data stored by the above writing operation.

In data reading, a drain voltage of 0.5 V is applied to the source lines SL1 and SL2 so as to be the same direction as the drain voltage of the writing operation, consequently, the stored data in the cell can be read out. Or a read operation in which a drain voltage is applied so as to be opposed direction as that of the writing operation may be performed.

In the case of storing two bit of data per a cell, a first bit of data is read out by the above method, and when another binary data of a second bit of data is read out, the voltage relationship is exchanged between the source and the drain, then the reading operation is performed again. In this case, similarly to the read operation for the first bit of data, the direction of the drain voltage in the reading operation may be either the same direction or a different direction from the drain voltage in the writing operation, but, in the read operation of the first bit and the second bit of data, the direction of the drain voltage may be required to change respectively.

A data erasing is performed by injecting hot holes caused by a band-to-band tunnel effect. Specifically, as shown in FIG. 3B, for example, a voltage Vg(−) of −5 V is applied to a gate electrode 13 (word line WL), and a voltage Vd(+) of 5 V is applied to a drain region 17D (bit line BL). At this time, a source region 17S (source line SL) is in the grounded (or opened) state.

Under this bias condition, due to a voltage of 10 V (to 12 V) applied between the gate electrode 13 and the drain electrode 17D, a hot hole is injected from the drain edge toward the charge trap in the charge storage layer (nitride film 12B, referred to FIG. 2).

By the injection of the hot hole, a charge of a hot electron injected in the writing operation recombines the hole charge and is canceled out, and the state of the memory transistor is shifted to the erase state.

In such operation, when the charge is locally injected and stored in the nitride film 12B shown in FIG. 2, by thermal treatment in later processes, the stored charge is diffused in the nitride film 12B toward a region in which charges are not stored. Therefore, spatially peak concentration in the stored charge distribution, which determines the threshold voltage of the nonvolatile memory, is reduced, consequently, the threshold voltage Vth is reduced.

The reduction of the threshold voltage Vth may appear as a disadvantage in its using time, namely, after a printed circuit board is mounted with the nonvolatile memory. That is, in thermal treatments in processes for fabricating a wafer and packaging, the injection of the charge is not performed, so the reduction does not cause a disadvantage. But, if the reduction of the threshold voltage Vth occurs in its actual using, it may cause a reduction of an operation margin or a malfunction.

Therefore, in the nonvolatile memory, the data retention characteristic is defined as one of reliability standards, so it may be needed that a satisfaction of an accelerated test to give a guarantee, for example, for 10 years at 150° C.

To overcome this disadvantage, it is effective that a diffusion of the stored charge is suppressed as much as possible.

The inventor investigated a relationship between the data retention characteristic and a trap density in detail, as a result, the inventor obtained an information that an upper limit of a density of bond between silicon and hydride (Si—H bond) in the nitride film 12B was required in order to suppress the diffusion of the charge injected locally in the nitride film 12B.

Hereinafter, details for obtaining the information will be described with experimentation data.

As is well known, a dangling bond of silicon becomes a bipolar trap site for an electron or a hole. And the Si dangling bonds may be able to be generated by a secession of an element from a terminated bond even if the element is other than hydrogen (H) such as a Si—Si bond and a Si—Cl bond. But, stochastically, most of them may be generated by the secession of hydrogen (H) from Si—H bond terminated by hydrogen. This is because hydrogen (H) secedes by thermal treatment easier than other element. Therefore, a film having a high Si—H bond density has a high density of the charge trap.

The Si—H bond density in the nitride film is controlled by changing one or more parameters in a component of the nitride film (namely, material gas), a gas flow rate, temperature, and pressure in a formation thereof. Among them, a type of the material gas and a flow rate are most sensitive parameter to the Si—H bond density. As the material gas for raising the Si—H bond density, there is known a combination of dichlorosilane DCS ($SiH_2Cl_2$) and ammonia ($NH_3$).

Figure 6:
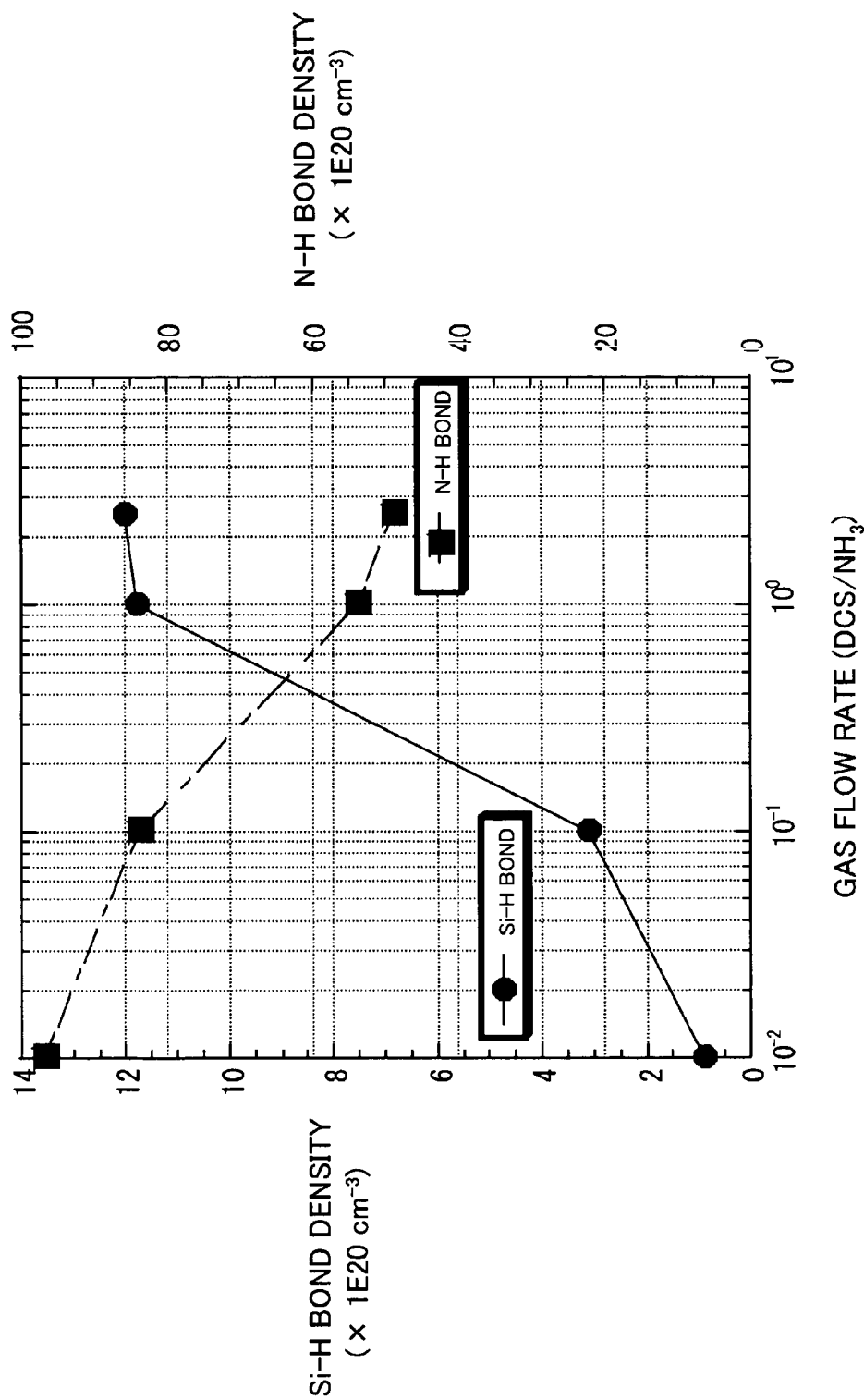
FIG. 6 is, concerning an first embodiment, a graph showing a relationship between a volume density of Si—H bond and a volume density of N—H bond by using a flow rate as a parameter.

Accordingly, the inventor investigated a relationship between a Si—H bond volume density and a N—H bond volume density by using a flow rate of DCS to ammonia (DCS/$NH_3$) as a parameter. FIG. 6 shows a result.

It is learned from the graph shown in FIG. 6, the Si—H bond density increases and the N—H bond density decreases as the flow rate (DCS/$NH_3$) is raised. In particular, the Si—H bond density increases sharply in the vicinity of the flow rate (DCS/$NH_3$) of 0.1, and is saturated when the flow rate is over 1.0.

Next, a relationship between the flow rate (DCS/$NH_3$) and the Si—H bond density, and the data retention characteristic were investigated.

Figure 7:
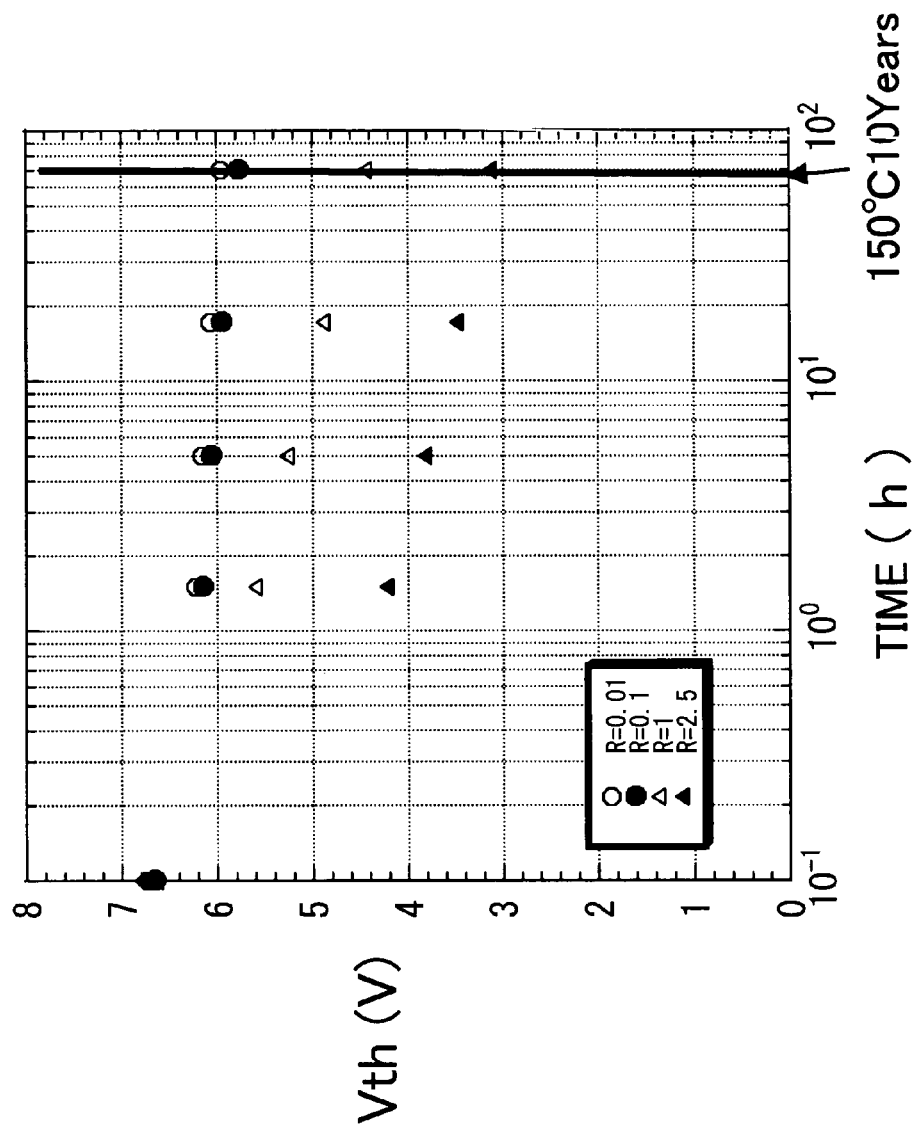
FIG. 7 is a graph showing a flow rate dependent of a data retention characteristic.

FIG. 7 is a graph showing a flow rate (DCS/$NH_3$) dependent of the data retention characteristic. FIG. 8A is a graph showing a relationship between the threshold voltage Vth retained at high temperature (150° C.) for 10 years and the SI—H bond density. And, FIG. 8B is a graph re-expressing FIG. 8A by making a difference of the threshold voltage ΔVth as ordinate.

As shown in FIG. 7, the threshold voltage Vth does not change sharply until the flow rate R=DCS/$NH_3$ is 0.1. At the flow rate R of 1, the threshold voltage Vth decreases sharply, and at the flow rate R of 2.5, the same decreases further sharply.

Figure 8B:
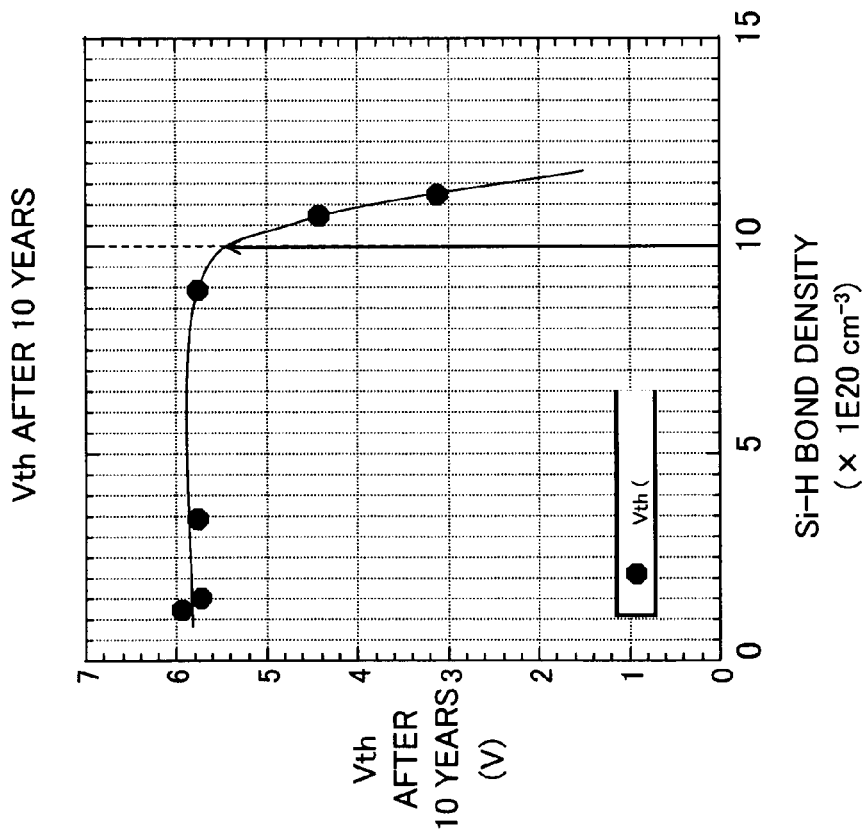
Figure 8A:
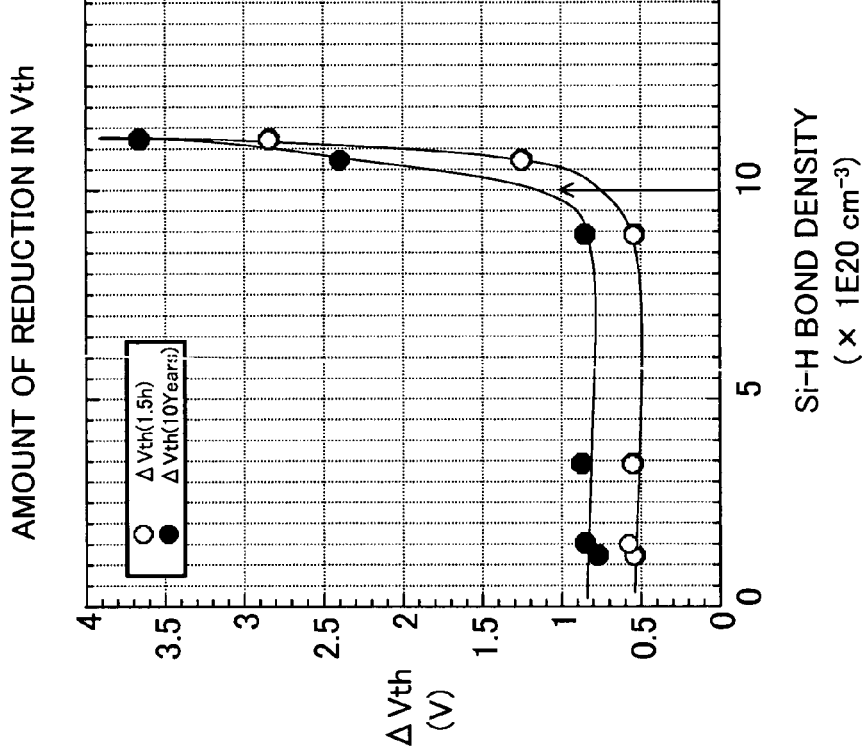
FIG. 8A is a graph showing a relationship between a density of Si—H bond and a threshold voltage after retaining for 10 years at a high temperature (150° C.)

A critical point in which the threshold voltage Vth change sharply is searched in the graphs of FIGS. 8A and 8B having the Si—H bond density at abscissa, then it is learned that the difference of the threshold voltage ΔVth is sharply raised when the Si—H bond density exceeds $1 \times 10^{21}$ cm$^{-3}$. This suggests that a probability that a charge captured in a certain trap moves into a neighbor trap increases sharply when the density of the charge trap exceeds a certain critical point.

As an above result, the Si—H bond density in the nitride film 12B is preferably not more than $1 \times 10^{21}$ cm$^{-3}$ in the present embodiment. More preferably, the Si—H bond density thereof is not less than $1 \times 10^{18}$ cm$^{-3}$ and not more than $1 \times 10^{21}$ cm$^{-3}$.

Here, the lower limit of the Si—H bond density is defined by a lower limit of an amount of trap (trap density) for a low voltage operation (an operation at not more than 6 V in voltage). If the Si—H bond density becomes lower than the lower limit of the trap density for the low voltage operation, the operation voltage may be made higher than 6 V to achieve a shift of the threshold voltage Vth demanded to maintain a good data retention characteristic. From the result of this investigation, it is learned that the Si—H bond density of the nitride film 12B is preferably not less than $1 \times 10^{18}$ cm$^{-3}$ and not more than $1 \times 10^{21}$ cm$^{-3}$.

Note that, the decrease of the Si—H bond density can be achieved by forming a SiON film as the charge storage layer other than by changing the flow rate described above.

In the present embodiment, it is learned that the data retention characteristic and the Si—H bond density has a relationship, and the threshold voltage thereof has a critical point. Therefore, the present embodiment has an advantage that, by using the critical point of the Si—H bond density as an indicator, film quality of the nitride film 12B and a condition for the film formation can be selected.

Second Embodiment

In the first embodiment, the evaluation of the charge storage layer (nitride film) is performed by using the Si—H bond density, and the measurement is performed by a spectroscopic ellipsometry method.

In the present embodiment, a higher accuracy evaluation parameter for the charge storage layer (nitride film) will be proposed and a method of evaluating film quality by using the above parameter and a method of producing a nonvolatile memory device including a step of evaluating the film quality will be described.

Paid attention to that an refractive index changed depending on a composition rate of the nitride film and a boundary portion between the nitride film and the other film could be identified by using a complex refractive index n*(=n+ik), the inventor investigated that the trap density of the nitride film is monitored by using the complex refractive index n* by a detail experimentation.

As a result, it was learned that the trap density can be monitored by using a complex refractive index in the vicinity of an ultraviolet absorption edge of the nitride film, or an extinction coefficient k (or absorption coefficient c) relating to an imaginary part thereof.

Graphs shown in FIGS. 9A and 9B show a dependent of DCS/$NH_3$ gas flow rate R to the refractive index n (a real part of the complex refractive index n*) and the extinction coefficient k at the ultraviolet absorption edge. The measurement was performed by using spectroscopic ellipsometer, and abscissa of the graphs indicates a measured wavelength.

From those graphs, it is learned that the refractive index n and the extinction coefficient k at the ultraviolet absorption edge increase as the flow rate R is raised. Additionally, a ratio of this change depends on the wavelength. Specifically, ratios of a parameter change of the refractive index n and the extinction coefficient k at the ultraviolet edge are small in the vicinity of 632 nm and become large as the wavelength is near the absorption edge, namely, as it is made short. And it is easily learned that the extinction coefficient k changes sensitively more than the refractive index n at the ultraviolet absorption edge.

Figure 10:
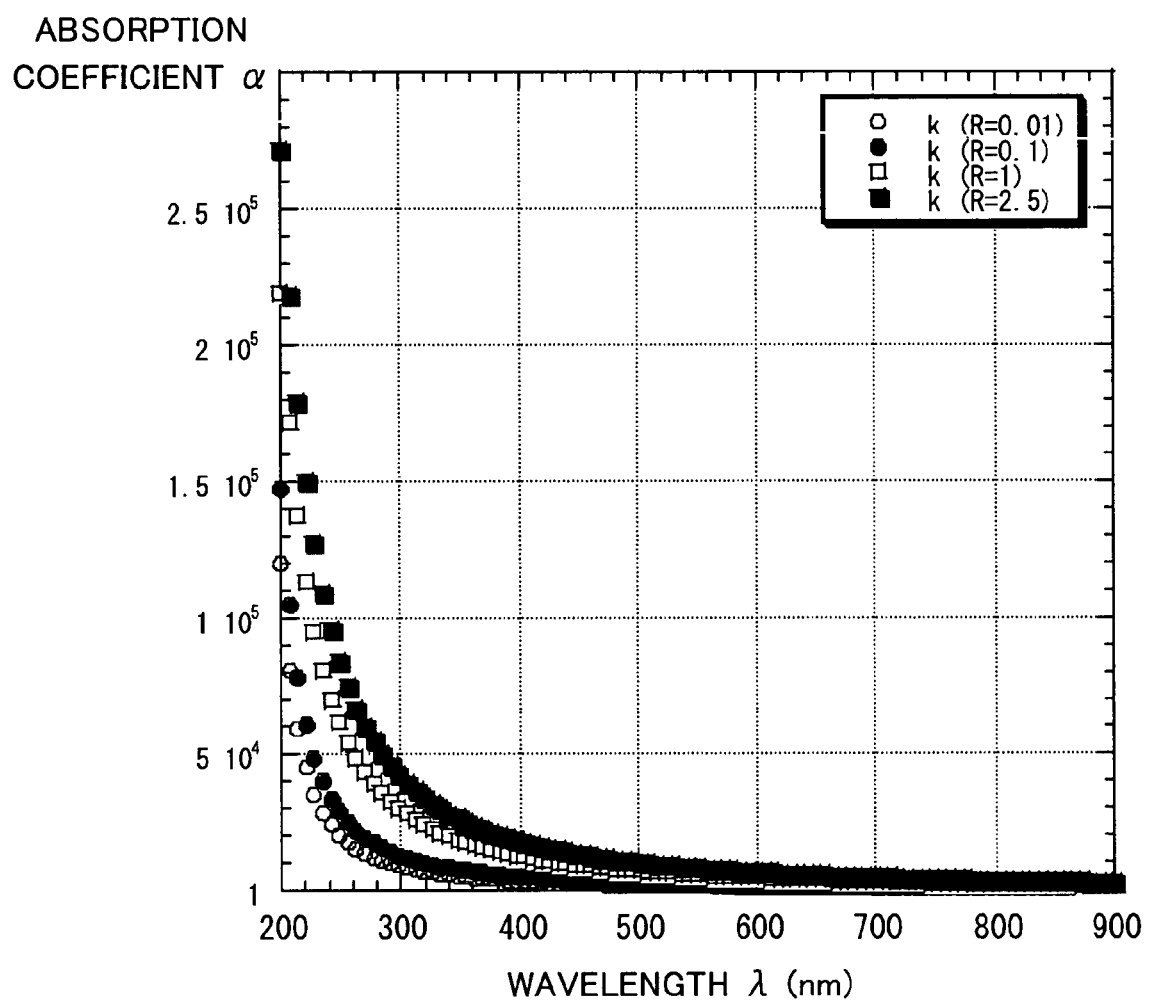
FIG. 10 is a graph of the wavelength dependent of an absorption coefficient at the absorption edge by using the flow rate as a parameter.

FIG. 10 shows a dependent of the flow rate R to an absorption coefficient α at the absorption edge.

The absorption coefficient α has a relationship with the extinction coefficient k of $\alpha=4\pi k/\lambda$ ($\lambda$: measured wavelength), so, similarly to the extinction coefficient k, it has a feature changing sensitively against the flow rate R.

Figure 11:
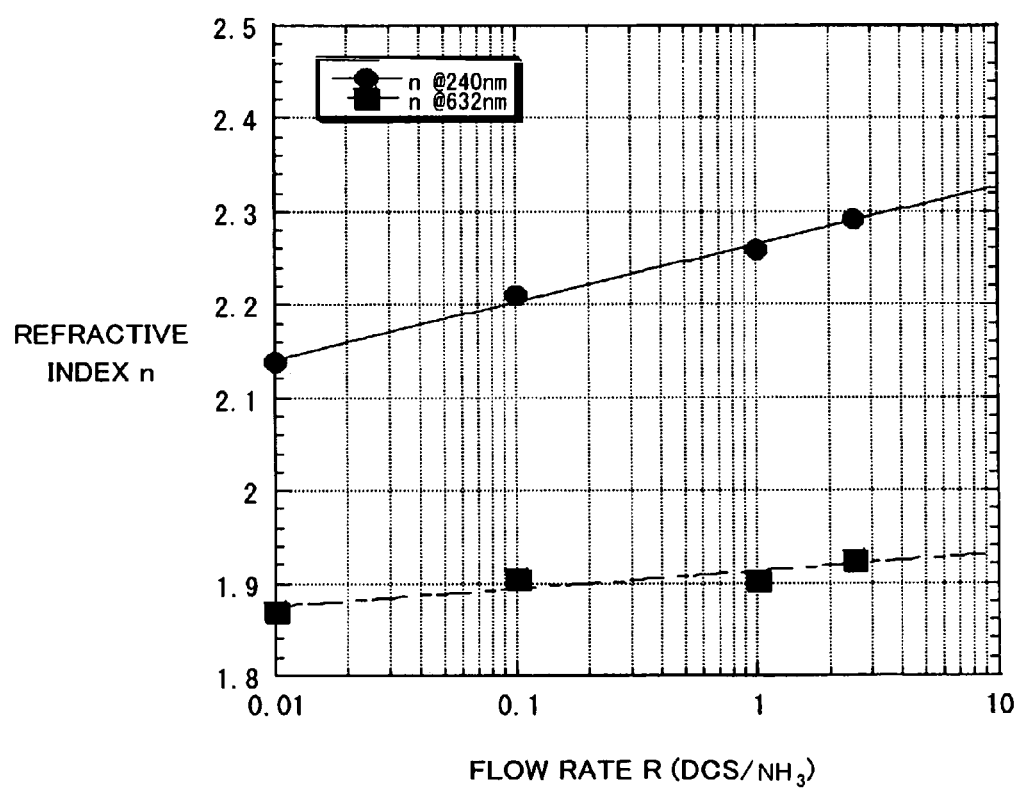
FIG. 11 is a graph of a flow rate dependent to a refractive index at the ultraviolet absorption edge.
Figure 12:
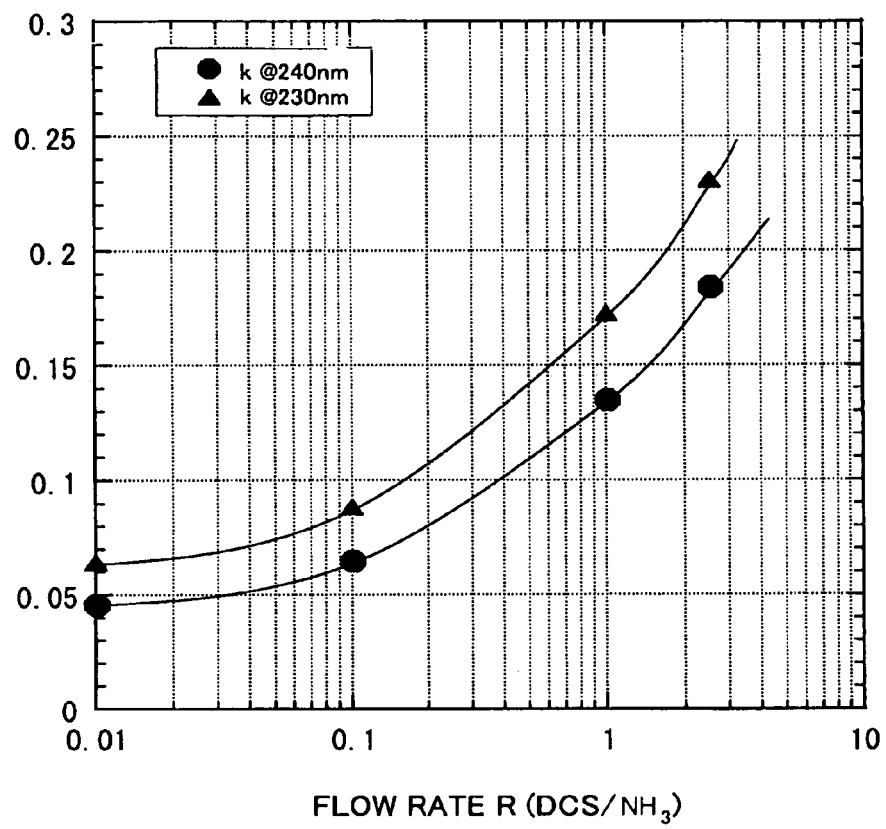
FIG. 12 is a graph of the flow rate dependent to the extinction coefficient at the absorption edge.

FIG. 11 shows the flow rate R dependent to the refractive index n at the ultraviolet absorption edge. And FIG. 12 shows the flow rate R dependent to the extinction coefficient k at the absorption edge.

From those graphs, it is learned that the refractive index n at the ultraviolet absorption edge or the extinction coefficient k at the absorption edge increases as the flow rate is raised.

And, specifically, as shown in FIG. 11, since the refractive index n at the wavelength of 240 nm has a gradient against the flow rate R larger than that of the wavelength of 632 nm which is used to a general evaluation, it is learned that the refractive index at the wavelength of 240 nm has higher sensitivity than that of 632 nm as a evaluation parameter. This is the same as the wavelength of 230 nm. And in evaluating the extinction coefficient k at the absorption edge at the wavelengths of 230 nm or 240 nm, the extinction coefficient k at the absorption edge increases more as the flow rate R is raised higher shown in FIG. 11.

As described above, the flow rate dependent of the complex refractive index at the absorption edge, more preferably, the extinction coefficient k (or absorption coefficient α) relating to the imaginary part was verified. Therefore, it is estimated that the evaluation of the data retention characteristic is possible by using those parameters.

Next, actually, the relationship between the refractive index n or the extinction coefficient k and the data retention characteristic (a change of the threshold voltage) was investigated.

Figure 13A:
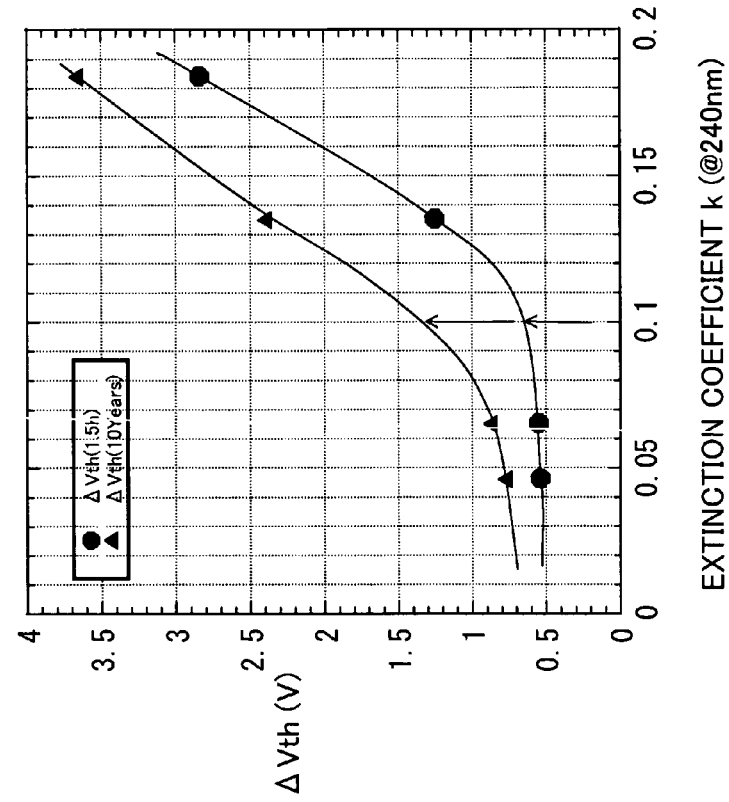
FIG. 13A is a graph showing an interrelation between a data retention characteristic, specifically, a difference of the threshold voltage, and the refractive index at the ultraviolet absorption edge.
Figure 13B:
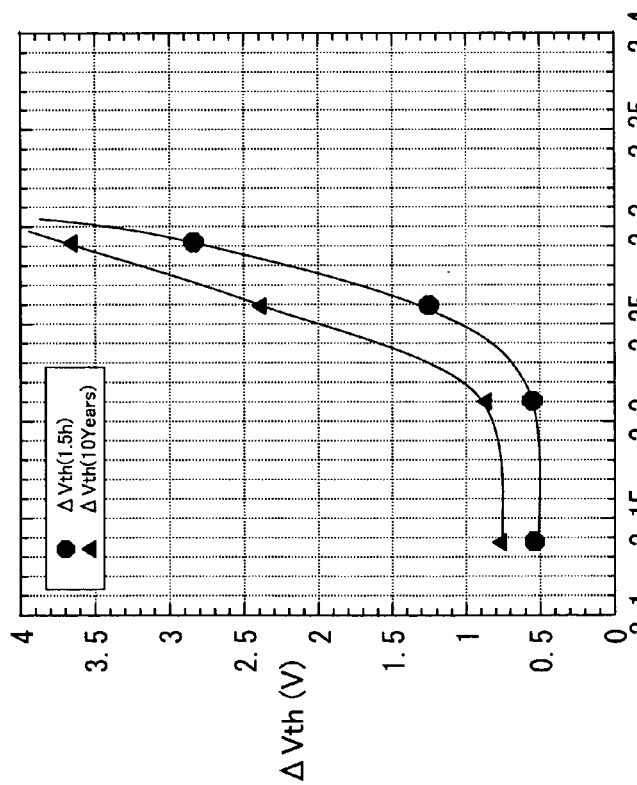
FIG. 13B is a graph showing an interrelation between a data retention characteristic, specifically, a difference of the threshold voltage, and the extinction coefficient.

FIG. 13 shows an interrelation between the refractive index n or the extinction coefficient k at the ultraviolet absorption edge and the data retention characteristic, specifically, the difference of the threshold voltage ΔVth. Here, the evaluated result at the wavelength of 240 nm is indicated, also the almost similar result was obtained at the wavelength of 230 nm.

The data retention characteristic and the difference of the threshold voltage (amount of dropped voltage) ΔVth from the initial threshold voltage Vth have an interrelation with the refractive index n or the extinction coefficient k at the ultraviolet absorption edge. It is learned that, as the refractive index n and the extinction coefficient k at the ultraviolet absorption edge increase more, the difference of the threshold voltage ΔVth increases and the data retention characteristic falls.

As described above, it was learned that, as the evaluation parameter of the film quality for evaluating a nitride film in the stacked insulation film for MONOS (an ONO film), the refractive index n, the extinction coefficient k, or the absorption coefficient α in the vicinity of the ultraviolet absorption edge was available other than the Si—H bond density described in the first embodiment. The refractive index n, the extinction coefficient k, or the absorption coefficient α has an advantage that the measurement wavelength in shorter and measurement accuracy is higher, even though a sharpness of the critical point affecting the data retention characteristic is inferior to that of the Si—H bond. Among them, the extinction coefficient k or the absorption coefficient α is large in a changing range in comparison with the refractive index n, so it is suitable as the evaluation parameter of the quality of the film.

In the present embodiment, the extinction coefficient k in the vicinity of the ultraviolet absorption edge of a material forming the charge storage layer (nitride film), namely, at 240 nm in the measurement wavelength is preferably 0.001, which is a detection limit, to 0.1 as a range without reducing the data retention characteristic.

Also, the extinction coefficient k at 230 nm in the measurement wavelength is preferably 0.001, the detection limit, to 0.14 as a range free from a reduction of the data retention characteristic.

In the present embodiment, this evaluation for the film quality is applied to a selection of a condition of a film formation in a method of producing a nonvolatile memory device. Here, the method of producing the nonvolatile memory device will be schematically described, and a step of evaluating the film quality which is feature part of the present embodiment will be described with reference to FIG. 2.

An element isolation insulating layer (not shown) and a P well are formed in a prepared semiconductor substrate 11. And an ion implantation for adjusting the threshold voltage is performed.

Then, the stacked insulation film 12 is formed on the semiconductor substrate 11 in which the P well and the element isolation insulating layer are formed.

In detail, a silicon oxide film (first oxidation film 12A) is formed by a thermal treatment at 1000° C. for 10 second by using a rapid thermal oxidation method (RTO method).

A silicon nitride film (nitride film 12B as the charge storage layer) is deposited thicker than 8 to 20 nm to be a final thickness on the first oxidation film 12A by low presser chemical vapor deposition (LP-CVD) method. The CVD method is performed at a substrate temperature of 750° C., for example, by using gas mixed dichlorosilane (DCS) and ammonia.

A surface of the formed silicon nitride film is oxidized by thermal oxidation to form a silicon oxidation film (second oxidation film 12C), for example, of 4 nm. The thermal oxidation is performed, for example, in an $H_2O$ atmosphere at a furnace temperature of 950° C. for 40 minutes. Therefore, a depth carrier trap of approximately not more than 2.0 eV in a trap level (difference of energy from a conductive band of the silicon nitride film) is formed to have a density of approximately 1 to $2\times10^{13}/cm^2$. The thermal silicon oxidation film (second oxidation film 12C) is formed of 1.5 nm per the silicon nitride film (the nitride film 12B) of 1 nm, a thickness of the underlying silicon nitride film is decreased at the above ratio, so the silicon nitride film is made the final thickness.

A conductive film serving as the gate electrode 13 (word line WL, referred to FIG. 4) is deposited, and the conductive film and the underlying stacked insulation film 12 are processed together by the same pattern. After that, P-type impurities are injected by a tilt ion implantation to form the pocket region 15. Then, n-type impurities are ion-implanted to form the LDD regions 14S and 14D.

Then, the spacers 16S and 18D made of insulation are formed, and the N-type impurities are ion-implanted to form the source region 17S and the drain region 17D.

After that, if necessary, a deposition of an interlayer insulation film, a formation of a contact, and a formation of an upper layer wiring are performed. Finally, a process for forming an overcoat and a process for opening a pad are performed to achieve the nonvolatile memory transistor.

The method of producing the nonvolatile memory transistor in the present embodiment has steps for performing the evaluation of the film quality in the middle of the production of the memory transistor, namely, in a formation of the nitride film 12B.

In detail, in a step before the film formation of the nitride film 12B, there is an interrelation setting step for preparing an interrelation between the Si—H bond density of the nitride film 12B shown in FIG. 12B and the extinction coefficient k (or absorption coefficient α) in the wavelength in the vicinity of the ultraviolet absorption edge for a material forming the nitride film 12B in advance. Then, in the measurement step when determining a condition of the film formation for the nitride film 12B in the producing step, the extinction coefficients k (or absorption coefficient α) is measured in every nitride film having a different condition of the film formation. Then, from the interrelation between the measured extinction coefficient and the Si—H bond density, the condition of the film formation that the Si—H bond density becomes within a predetermined range, namely, not more than $1 \times 10^{21}$ cm$^{-3}$ is determined.

The nitride film 12B is formed by using the determined condition, for example, the flow rate R, which allows a formation of the nitride film 12B satisfying the desired Si—H bond density range and having a satisfying quality of the film.

Note that, without preparing the interrelation between the extinction coefficient k (or the absorption coefficient α) and the Si—H bond density, a value of the extinction coefficient k (or absorption coefficient α) may be measured in the above measurement step. The measured value is stored as a parameter for the evaluation of the film quality in advance, an appropriate range is determined by using the value. In this case, in the step of determining the condition of the film formation, whether or not the appropriate range is satisfied is made a standard for deciding the film quality decision.

Third Embodiment

In the present embodiment, as a parameter of the nitride film for determining the data retention characteristic, a use of an optical bandgap will be proposed instead of the Si—H bond density, the extinction coefficient k, or absorption coefficients α used in the first and the second embodiment. And, a method of evaluating the film quality and a method of producing a nonvolatile memory device including a step of evaluating the film quality will be described.

The inventor investigated a relationship between the data retention characteristic and an optical property of the nitride film in detail, as a result, obtained an information that an upper limit of an optical bandgap in the nitride film 12B was demanded to suppress the diffusion of the charge injected locally in the nitride film 12B.

And, the inventor found that, by the optical bandgap given from the absorption coefficients α of the nitride film, defective or indefectible of the data retention characteristic can be monitored, experimentally.

The absorption coefficient αL of the nitride film can be prepared by the similar method to the second embodiment. In the present embodiment, first, similarly to FIG. 10 in the second embodiment, the absorption coefficient α of the nitride film 12B (referred to FIG. 2) was measured up to approximately $2.6 \times 10^5$ cm$^{-3}$, and the wavelength of abscissa thereof was converted to a photon energy unit (hereinafter, referred to an energy, simply).

Figure 14A:
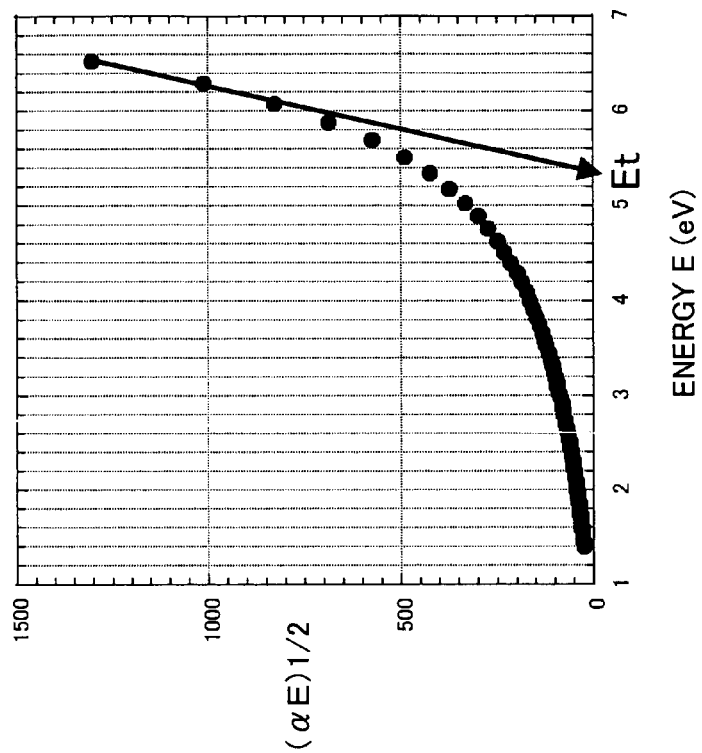
FIG. 14A is a graph in which abscissa of a graph showing the wavelength dependent of the absorption coefficient α similarly to FIG. 10 is converted to photon energy unit.

The converted graph is shown in FIG. 14A.

Figure 14B:
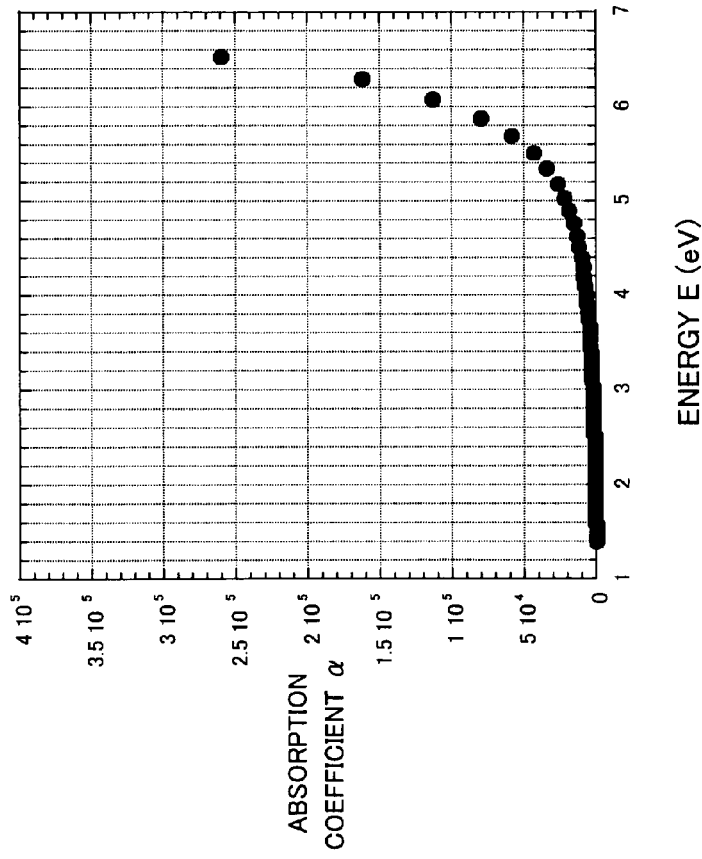
FIG. 14B is a graph in which ordinate of FIG. 14A is converted to $(\alpha SE)\cdot \frac{1}{2}$ in order to apply Tauc plotting method, both concerning a third embodiment.

Then, as shown in FIG. 14B, the Tauc-plot method was performed in the vicinity of the absorption edge, so the optical bandgap Et of the nitride film was given. According to the Tauc's theory, a relationship between the absorption coefficient α and the optical bandgap Et is determined by a formula of $(\alpha E) \cdot 1/2 = B(E-Et)$ used photon energy unit E, a constant (a fitting coefficient) B, and the optical bandgap Et. FIG. 14B is a graph replotted the respective data shown in FIG. 14A by using $(\alpha E) - 1/2$ as ordinate and energy E as abscissa. It is obvious from the Tauc' theory that the energy E at the point in which a tangential line at a high energy side of the data curved line in FIG. 14B intersects to abscissa corresponds to the optical energy band Et, namely, corresponds to an energy from a valence band of the center of the trap density.

The above method was repeated to samples produced by changing the flow rate (DCS/NH$_3$) of DCS to ammonia to obtain the optical energy Et in every flow rates R.

Figure 15:
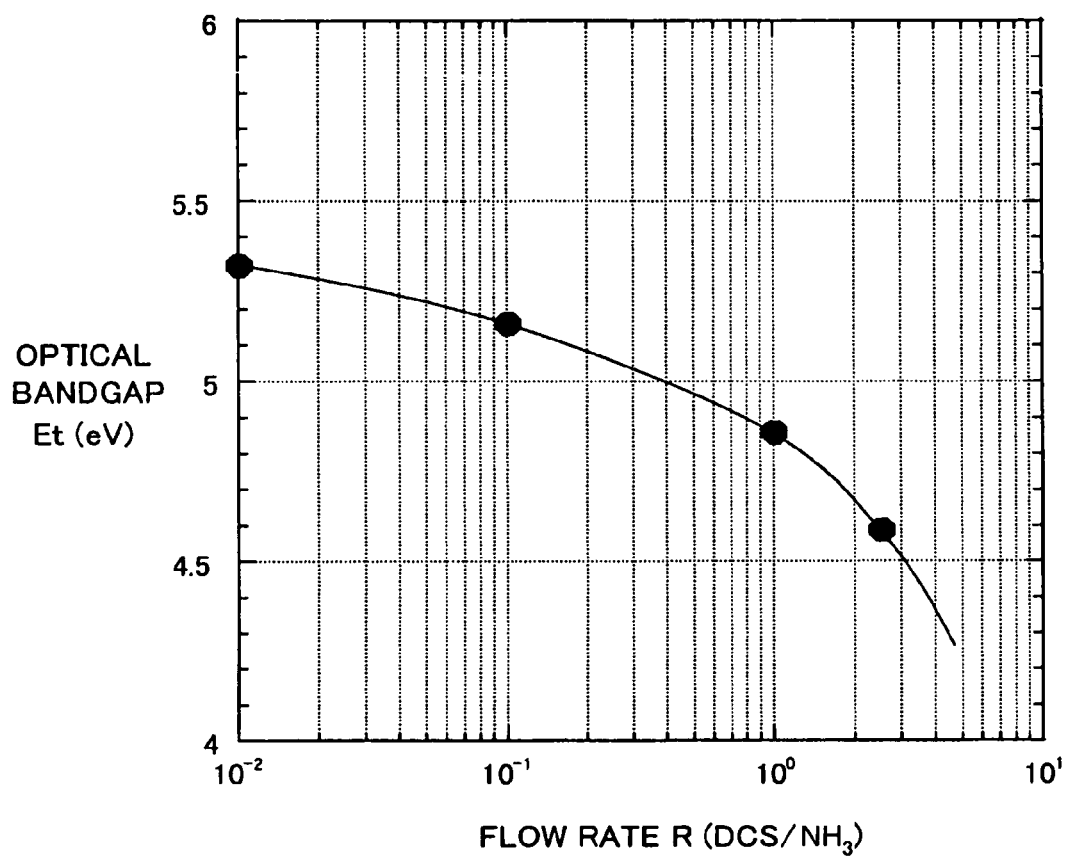
FIG. 15 is a graph showing a flow rate dependent to an optical bandgap.

FIG. 15 shows the flow rate dependent of the optical bandgap.

From this graph, it is learned that the optical bandgap Et is made small as the flow rate R becomes large.

Below, the relationship between the data retention characteristic and the optical bandgap was investigated.

The an accelerated test corresponding to the case after keeping for 10 years at temperature of 150° C. was performed to four memory transistors having the threshold voltage Vth used to the measurement in preparing FIG. 15 and having different flow rates R, and in the writing operation state, the threshold voltage Vth before and after the accelerated test was measured to prepare the data retention characteristic.

Figure 16A:
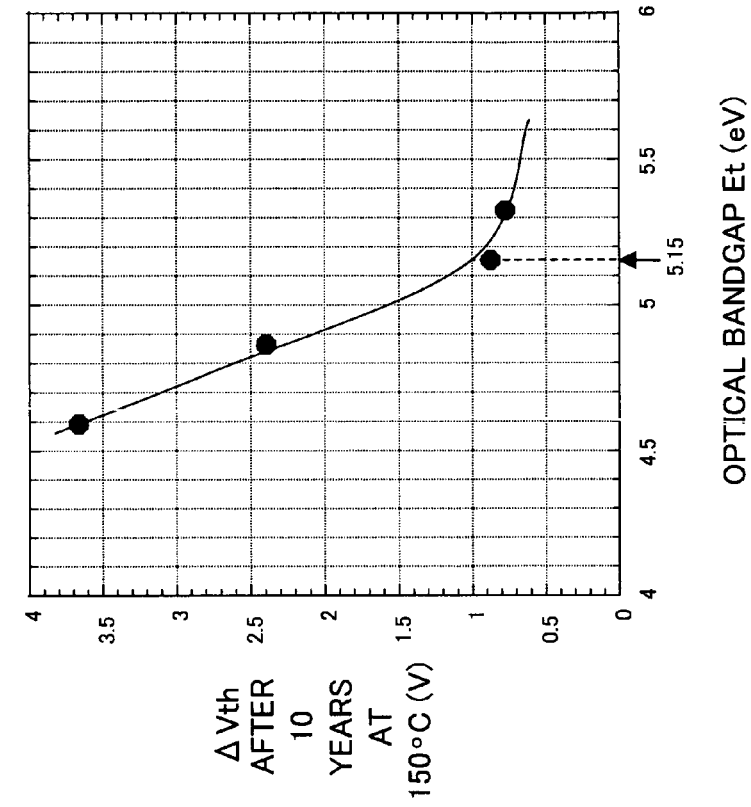
FIG. 16A is a graph showing an optical bandgap dependent to a data retention characteristic by indicating a threshold voltage after an accelerated test as ordinate.
Figure 16B:
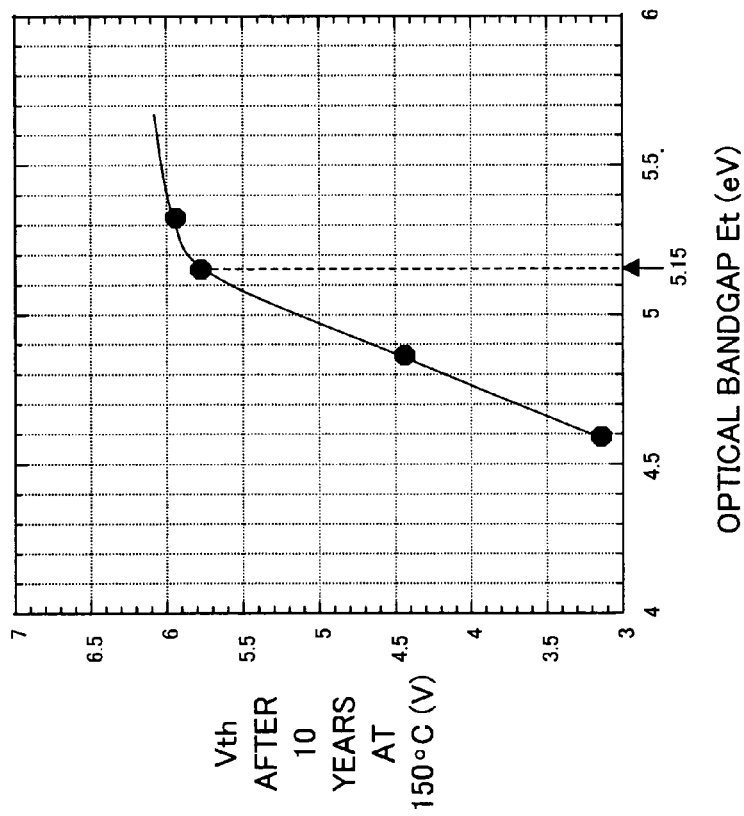
FIG. 16B is a graph showing the same indicating a difference of the threshold voltage before or after the accelerated tests as ordinate.

FIGS. 16A and 16B show the optical bandgap dependent to the data retention characteristic. Here, FIG. 16A is a graph indicating the threshold voltage Vth after the accelerated test as ordinate and the optical energy band Et as abscissa. And, FIG. 16B is a graph converted with the graph shown in FIG. 16A to a graph indicating the difference of the threshold voltage ΔVth before and after the accelerated test as ordinate.

As shown in FIGS. 16A and 16B, as the optical bandgap Et drops more, the threshold voltage after 10 years in the memory transistor in the writing state is reduced. The reduction of the threshold voltage Vth in the writing state decreases a threshold voltage margin (Vth margin) in the reading out operation, so the reading out of data becomes difficult.

The reduction of the threshold Vth, obviously from FIGS. 16A and 16B, changes at a point of 5.15 eV in the optical bandgap as a border to increase the reduction rate. Namely, the threshold voltage change has the critical point at 5.15 eV in the optical bandgap. If the optical bandgap Et is larger than the critical point, a desirable data retention characteristic may not be achieved. Therefore, in order to achieve the desirable data retention characteristic, it is demanded that the optical bandgap is larger than 5.15 eV.

In the present embodiment, the standard that the optical bandgap is not less than 5.15 eV is an indicator for evaluating the nitride film.

As a specific evaluation process, in the step of setting the interrelation described in the second embodiment, the interrelation between the data retention characteristic and the optical bandgap Et is prepared in advance. In the measurement step described above, the absorption coefficient α is measured in the respective nitride film having the film quality (including a material quality) and the condition of the formation, the optical bandgap Et is prepared based on the measured result by using the above method. Then, a material and formation condition for the nitride film is determined to be not less than 5.15 eV in the optical bandgap Et. The method of producing the memory transistor according to the present embodiment differs from that of the second embodiment in the point of a method of determining a formation condition for the nitride film and a film formation of the nitride film by using the determined condition. Others are in common with the method of producing the memory transistor according to the second embodiment, and they are omitted with descriptions here.

As described above, in the present embodiment, it was learned that the data retention characteristics and the optical bandgap have the interrelation, and in the interrelation, the critical point of the threshold voltage exists at a writing state of the memory transistor. Therefore, in the present embodiment, by using the critical point of the optical bandgap as an indicator, the film quality and the formation condition for the nitride film can be selected.

Fourth Embodiment

In the present embodiment, the evaluation parameter for the high accuracy charge storage layer (nitride film) will be proposed, and a method of evaluating a film quality using the same and a method of producing the nonvolatile memory device including a step of evaluating the film quality will be described.

The inventor found that the peak wavelength of the luminance spectrum in the nitride film changed depending on a component ratio of the nitride film, and experimentally investigated that the film quality of the nitride film could be monitored by utilizing the peak wavelength of the luminance spectrum.

Further, the inventor experimentally found that the trap density could be monitored by utilizing the peak wavelength of the luminance spectrum of the nitride film.

Figure 17:
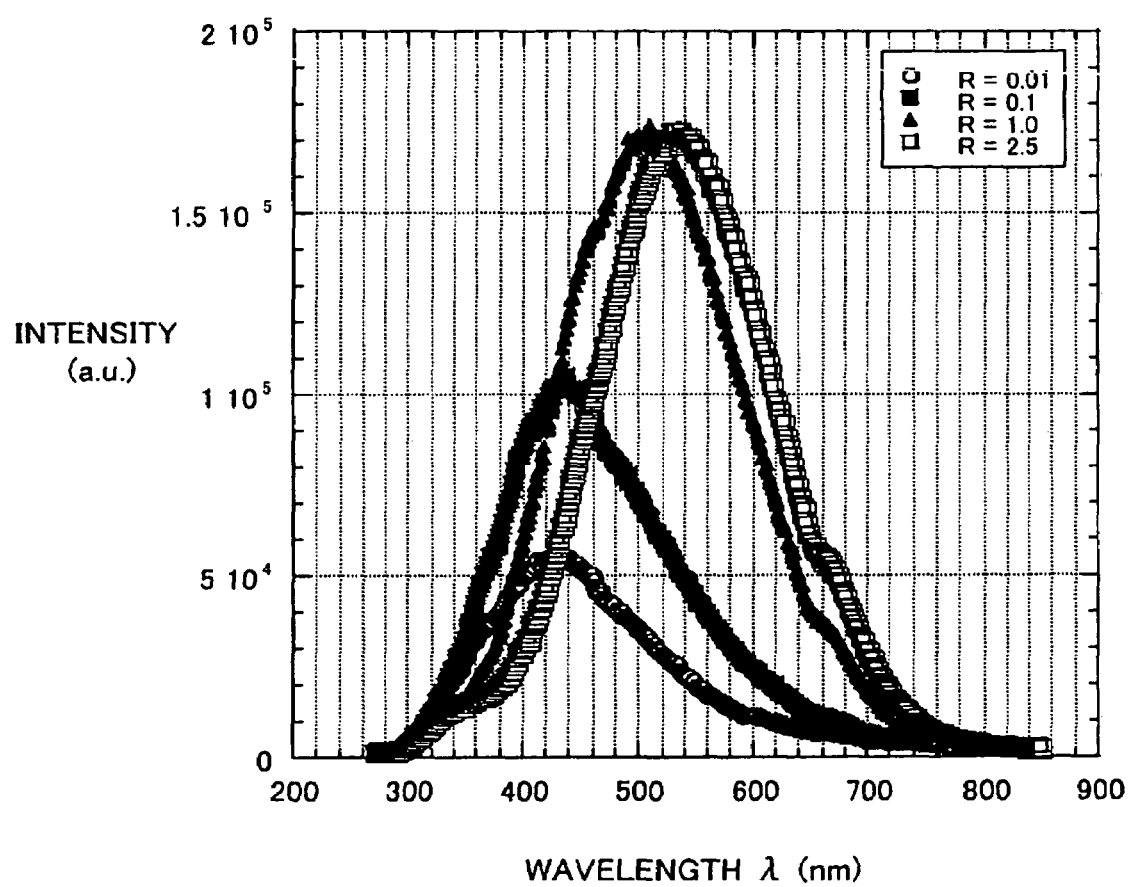
FIG. 17 is, concerning a fourth embodiment, a graph showing and superposing measured results of luminance spectrum illuminated from four memory transistors having different flow rates.

A graph shown in FIG. 17 shows overlapped four luminance spectrum measured by changing the flow rate.

The measurement was performed by using a spectrophotometer, and the excitation wavelength was 250 nm. Ordinate of the graph shown in FIG. 17 indicates a measured strength of the luminance spectrum (any unit: a.u.), and abscissa thereof indicates a measurement wavelength.

From FIG. 17, it is learned that the luminance spectrum is different depending on the flow rate R. Further it is learned that the respective luminance spectrum has a peak and the peak wavelength increases as the flow rate R is made large.

Figure 18:
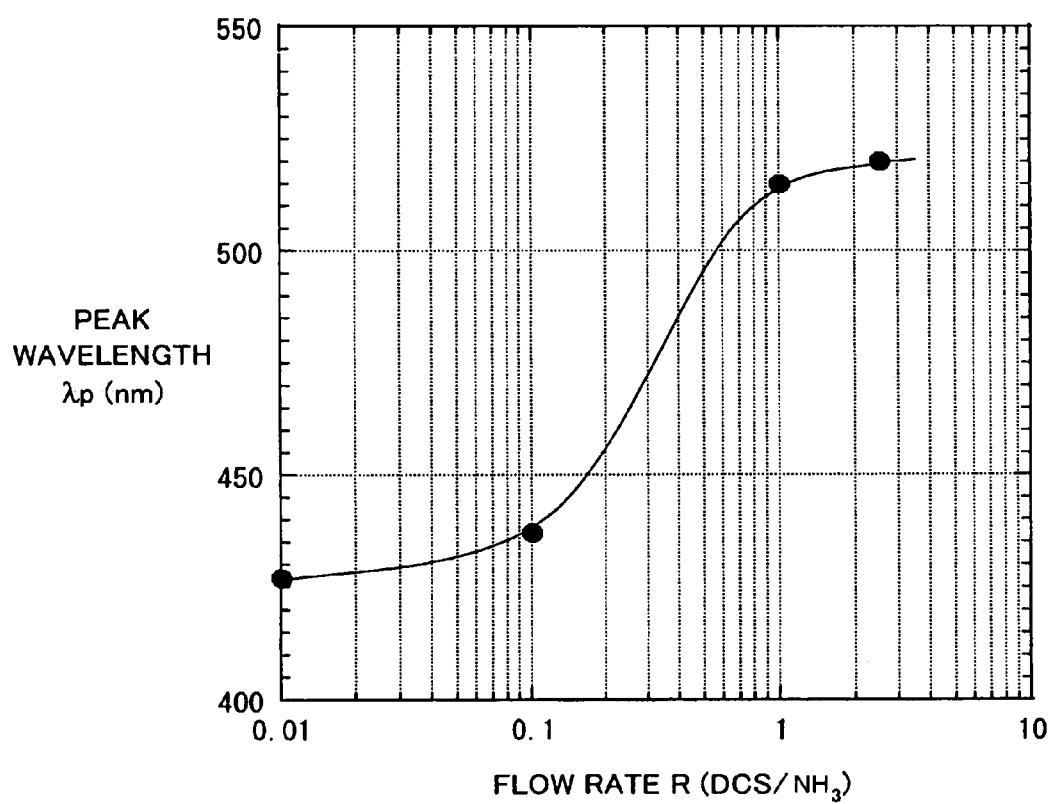
FIG. 18 is a graph showing a flow rate dependence of a peak wavelength of the luminance spectrum.

FIG. 18 shows a flow rate dependent to the peak wavelength of the luminance spectrum.

From the graph, it is learned that the peak wavelength $\lambda p$ of the luminance spectrum becomes large (shifting to a long wavelength side) as the flow rate R becomes large.

Below, a relationship between the data retention characteristic and the peak wavelength of the luminance spectrum was investigated.

An accelerated test corresponding to the case maintained for 10 years at 150° C. was performed to four memory transistors which were used to the measurement for preparing FIG. 18 and which had the threshold voltages Vth in the writing state and different flow rate R respectively, the threshold voltage Vth before and after the accelerated test were measured to obtain the data retention characteristic.

Figure 19:
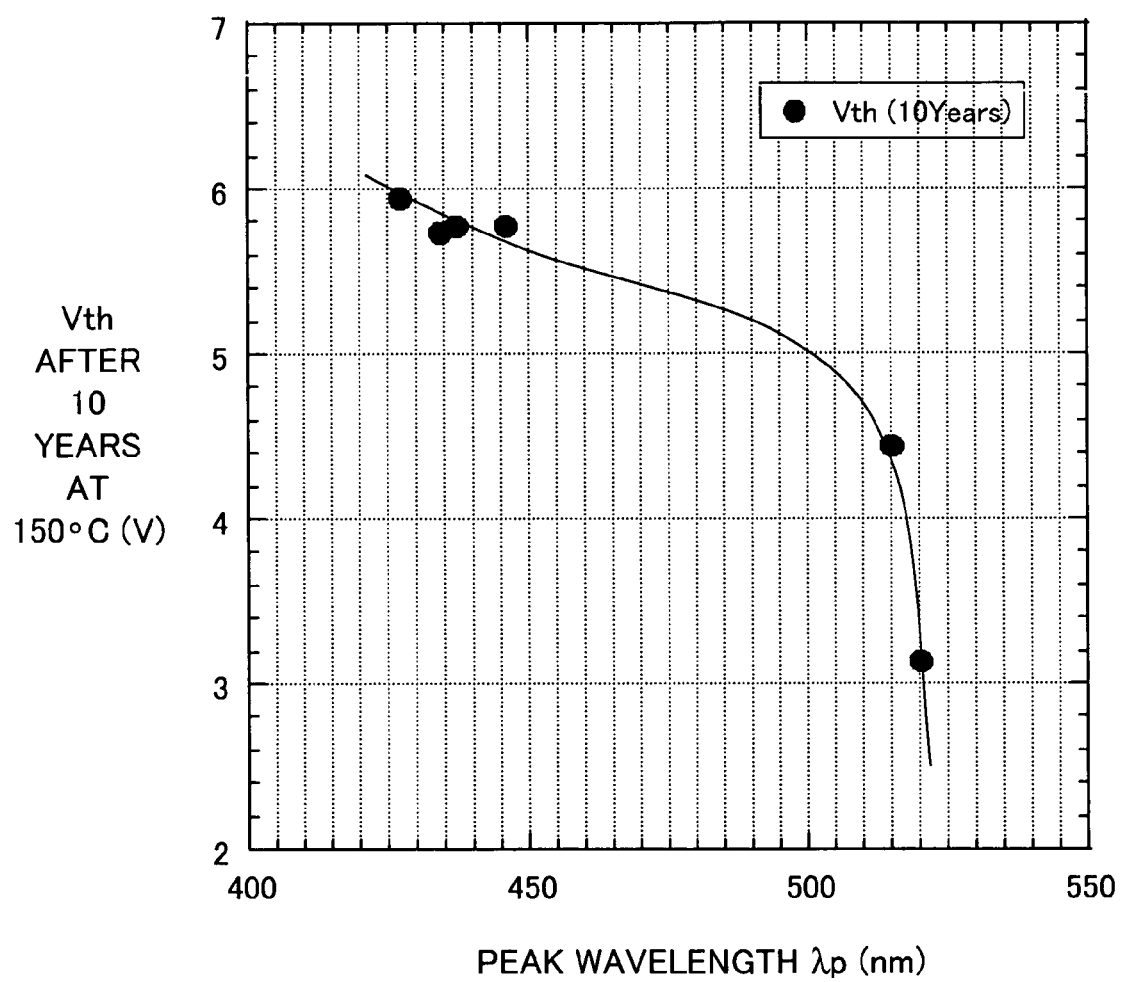
FIG. 19 is a graph of a peak wavelength dependence of a data retention characteristic.

FIG. 19 shows the peak wavelength dependent of the luminance spectrum to the data retention characteristic. The graph indicates the threshold voltage Vth after the accelerated teat as ordinate and the peak wavelength $\lambda p$ of the luminance spectrum as abscissa.

From the graph, it is learned that the threshold Vth after 10 years in the memory transistor in the writing state is reduced as the luminance spectrum wavelength $\lambda p$ becomes large (shifting to a long wavelength side). The reduction of the threshold voltage Vth in the writing state causes the reduction of the threshold voltage margin (Vth margin) in reading data. Consequently, the read operation of data is difficulty.

In the reduction of the threshold voltage Vth, obviously from FIG. 19, the reduction rate becomes sharply increase in the vicinity of 500 nm in the peak wavelength $\lambda p$ of the luminance spectrum as a border. Namely, the change of the threshold voltage has a critical point at 500 nm in the peak wavelength $\lambda p$ of the luminance spectrum, so, if the peak wavelength $\lambda p$ is large, a good data retention characteristic may not achieved. Therefore, in order to achieve the good data retention characteristic, the peak wavelength $\lambda p$ of the luminance spectrum is demanded to not more than 500 nm.

Below, the relationship between the data retention characteristic and the optical bandgap was investigated.

Figure 20:
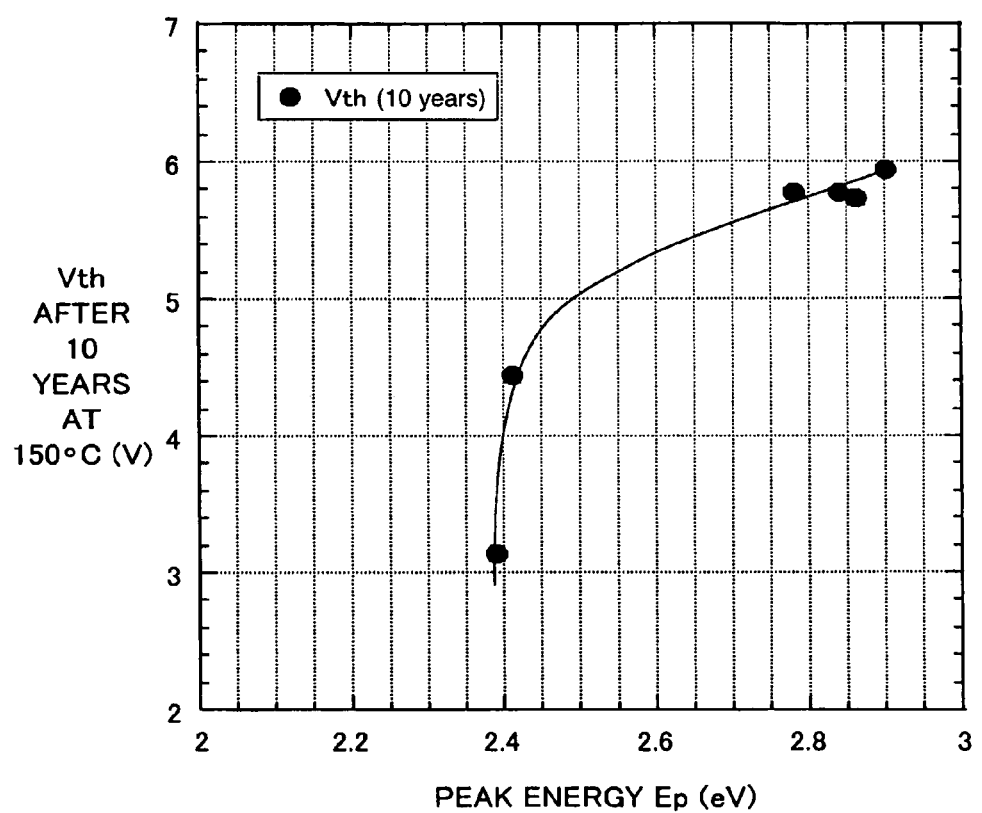
FIG. 20 is a graph converted the peak wavelength of abscissa in FIG. 19 into a photon energy unit.

FIG. 20 shows a graph converted with the peak wavelength of abscissa in FIG. 19 to photon energy unit (eV). The converted energy indicates the peak energy of the luminance spectrum.

From the graph, it is learned that the threshold voltage Vth after 10 years in the memory transistor in the writing state decreases as the peak energy Ep of the luminance spectrum is reduced.

In the reduction of the threshold voltage Vth, obviously from FIG. 20, the reduction rate becomes sharply increase in the vicinity of 2.5 eV in the peak energy Ep of the luminance spectrum as a border. Namely, the change of the threshold voltage has the critical point at 2.5 eV in the peak energy Ep of the luminance spectrum, so if the peak energy Ep is smaller than the above, a good data retention characteristic may not be achieved. Therefore, in order to achieve the good data retention characteristic, the peak energy of the luminance spectrum is demanded to not less than 2.5 eV.

In the present embodiment, a standard in which the peak wavelength $\lambda p$ of the luminance spectrum is not more than 500 nm, or a standard in which the peak energy Ep is not less than 2.5 eV is defined as an indicator for the evaluation of the nitride film.

As a specific evaluation process, in the step of setting the interrelation described in the second embodiment, the interrelation between the data retention characteristic and the peak wavelength $\lambda p$ or the peak energy Ep are prepared in advance. In the measurement step described above, the peak wavelength $\lambda p$ or the peak energy Ep is measured in the respective nitride film in which the film quality (including a material quality) and formation condition are difference. Then, a material and formation condition for the nitride film are determined to be not more than 500 nm in the peak wavelength $\lambda p$ or not less than 2.5 eV in the peak energy Ep.

The method of producing the memory transistor according to the present embodiment differs from the second embodiment at the points of a method of determining the film formation of the nitride film and a film formation of the nitride film by determining a formation condition and using the formation condition. Other process steps are in common with the method of producing the memory transistor according to the second embodiment described above, and they are omitted with descriptions.

As described above, in the present embodiment, it was learned that the data retention characteristic and the peak wavelength or the peak energy of the luminance spectrum to the nitride film had the interrelation, and also in the interrelation, that the critical point of the threshold voltage existed in the writing state of the memory transistor. Therefore, in the present embodiment, by using the peak wavelength or the peak energy of the luminance spectrum as an indicator, the film quality and the formation condition for the nitride film can be selected. The indicator concerning the luminance spectrum has an advantage that there is a sharpness in the critical point affecting the data retention characteristic, and it is useful as a reference for deciding defective or indefectible of the nitride film.

Fifth Embodiment

The present embodiment, in order to further improve the charge retention characteristic, relates to a MONOS type memory transistor intentionally formed with a structural transition layer between a bottom insulation film and the bulk layer of the nitride film. This embodiment is applicable to any of the first to the fourth embodiments described above.

Figure 21:
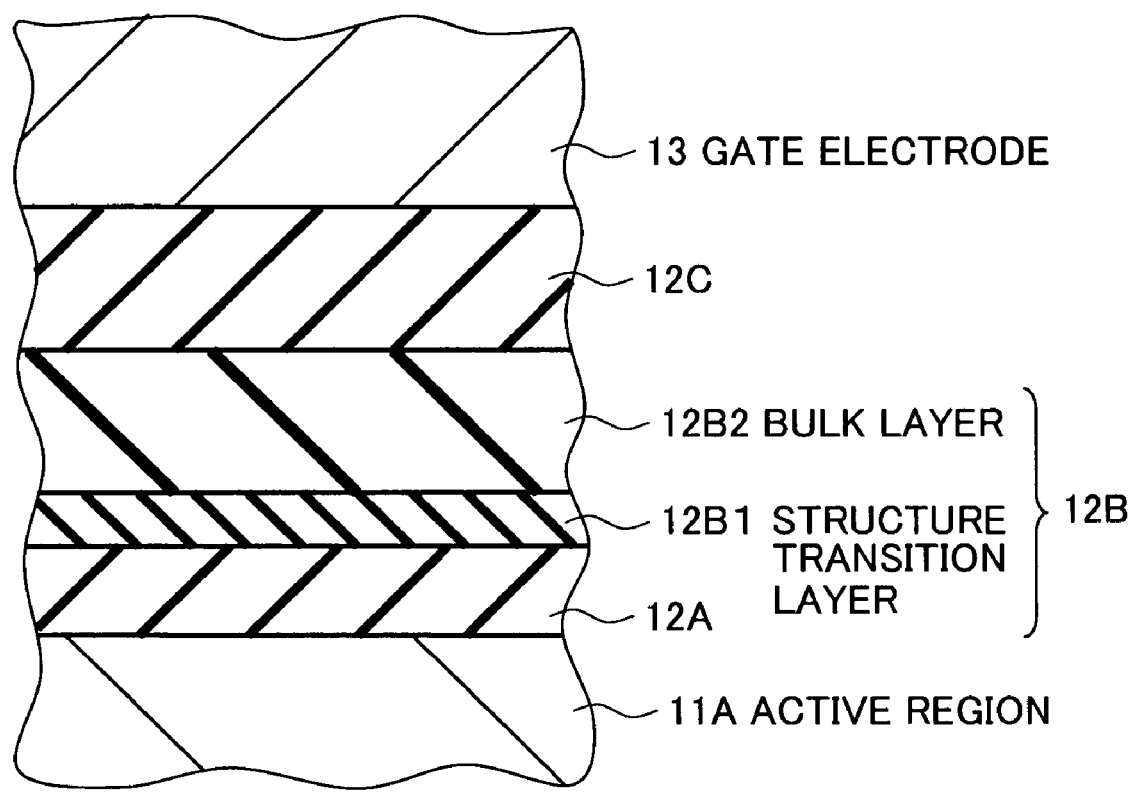
FIG. 21 is, concerning a sectional configuration of a MONOS type transistor according to a fifth embodiment, an enlarged view along a broken line A of FIG. 2.

FIG. 21 is an enlarged view along a broken line portion A in FIG. 2 in a sectional structure of the MONOS type memory transistor.

The memory transistor has a structure transition layer 12B1, for example, a SiON film, between the first oxidation film 12A serving as the bottom insulation film and the bulk layer of the nitride film 12 ($SiN_x$ film) serving as the charge storage layer. Although such structure transition layer 12B1 is necessarily formed between films having slightly different composition, it is intentionally provided to improve the film quality of the nitride film 12B in the present embodiment.

Figure 22:
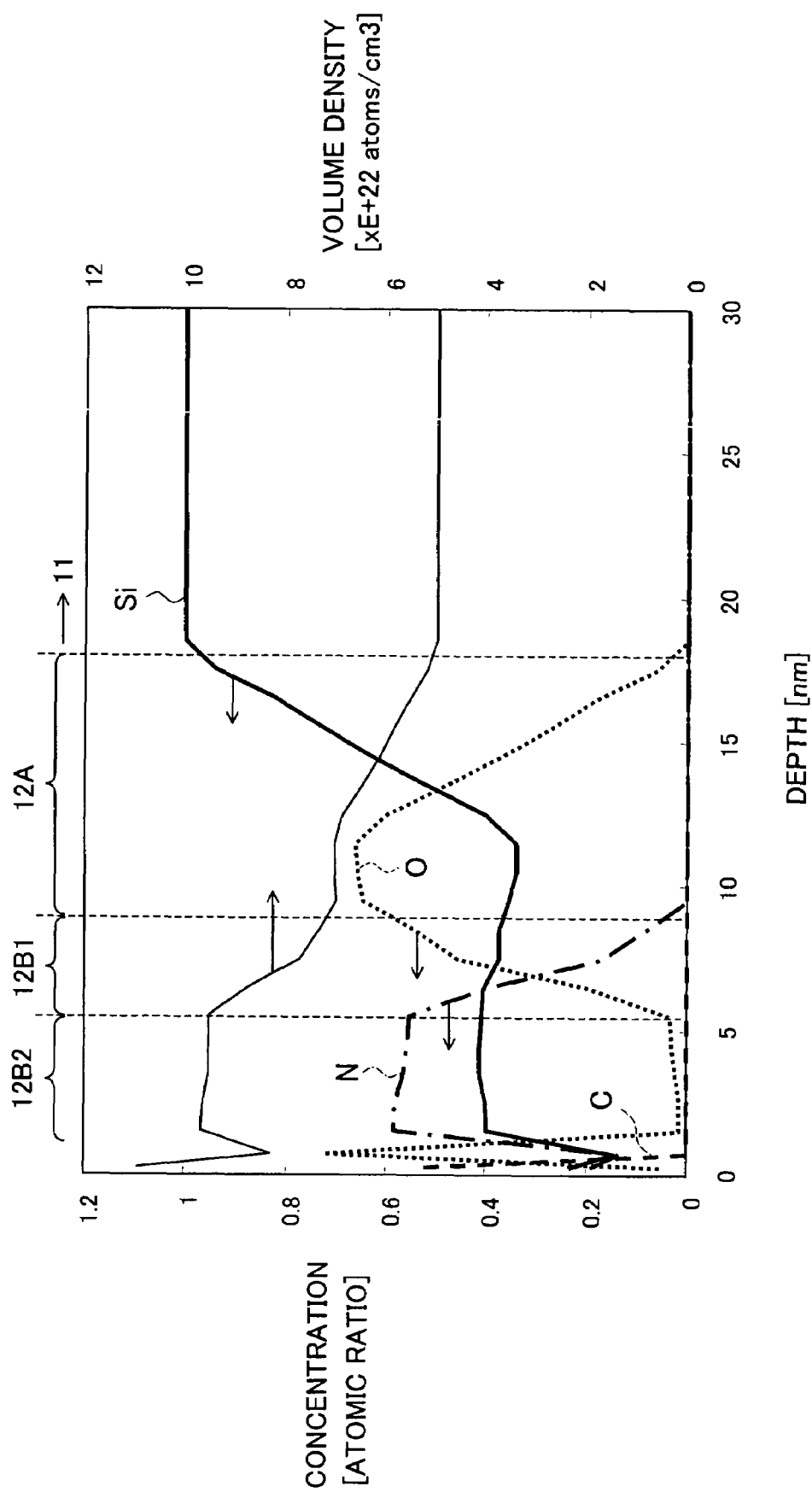
FIG. 22 is a graph showing a composition (concentration distribution profile) analyzed with a region of a substrate side nearer than a nitride film of a stacked insulation film by HRBS method.

FIG. 22 shows a composition (concentration distribution profile) of a region which is the stacked insulation film (ONO film) 12 at the substrate side than the nitride film 12B and which is analyzed by high resolution Rutherford backscattering (HRBS) method.

It is obviously learned that the structure transition layer 12B1 exists between the first oxidation film 12A and the bulk layer 12B2 of the nitride film 12B. The structure transition layer (SiON film) 12B1, as shown in FIG. 23, has a composition having a continuous refractive index. Namely, the SiON film (the structure transition layer 12B1) contacting with the first oxidation film 12A has the refractive index of 1.45, and the bulk layer (SiN layer) of the nitride film has the refractive index of 2.10. Also, the structure transition layer (SiON film) 12B1 is formed therebetween to continuously change the refractive index in three layers.

Further, generally, in the case of forming the nitride film on the oxidation film, a surface of the oxidation film is nitrided before the nitride film is formed. This is because, if the nitride film is directly formed on the oxidation film, an incubation time may be generated to prevent a core from growing uniformity at the surface in an initial process of forming the nitride film at the surface of the oxidation film to thereby deteriorate morphology of a surface. By an ammonia treatment of the surface, Si—H bond or N—H bond is formed to suppress the generation of the incubation time.

However, in the case of performing the nitride treatment, for example, by ammonia, the oxidation film may be injected with nitrogen additionally hydrogen to increase the number of Si—H bond in the first oxidation film 12A. Si—H bond generates the dangling bond of Si by a thermal treatment to form an electron trap or a hole trap, consequently, a hole injection tolerance deteriorates. This causes the data retention characteristic.

On the other hand, in the case of forming the SiON film at the surface of the oxidation film as the structure transition layer 12B1, the incubation time in forming the nitride film 12B may be decrease and a high quality nitride film 12B is achieved depending on the cases even if the nitridation treatment is not performed. This is because an initial core formation of the nitride film 12B can be easily performed in the case where Si—H bond or N—H bond exists at the surface.

In the present embodiment, the structure transition layer 12B1 is intentionally formed with a necessary thickness and the first oxidation film 12A is not demanded to the ammonia ($NH_3$) treatment, so it has an advantage that the high quality stacked insulation film (ONO film) 12 which is low in the charge trap and high in the data retention characteristic can be achieved.

Below, an example of a method of forming the ONO film will be described in detail. As a film formation apparatus thereof, a LP-CVD apparatus with a rapidly rising and cooling temperature type is used.

First, by a dry oxidation method, the first oxidation film 12A is formed at 900° C. with 8 nm. Then, the SiON film (the structure transition layer 12B1) is formed by controlling a gas timing. In detail, a mixed gas of dichlorosilane $SiH_2Cl_2$ (DCS) and $N_2O$ is flowed on the first oxidation film 12A at 750° C. and kept for a delay time of several millisecond to several minutes, then ammonia ($NH_3$) gas is flowed in a chamber.

By this operation, the structure transition layer 12B1 (SiON film) can be formed on the surface of the oxidation film easily. Note that, the delay time depends on the component of the ONO film.

At this time, preferably, these film formations are continuously performed without exposing a wafer in air.

And, the composition of the SiON film to be the structure transition layer 12B1 is made two types, so the structure transition layer 12B1 may be two-layer structure. Further, the composition of the SiON film to be the structure transition layer 12B1 is made over two types, so a third SiON film having a composition between the both may be formed between the first and the second SiON films. A plurality of these layers can be identified if a refractive index of the respective single layers is evaluated and used as a reference. As a result, the stacked insulation film 12 in which the refractive index or other film quality parameter change stepwise is achieved.

FIG. 24 is a view of, as an example of the case changing the refractive index continuously, in detail, an example of an injection timing of gas.

Here, the first oxidation film 12A is made from a silicon oxidation film, the structure transition layer 12B1 is made from a SiON film, and the bulk layer 12B2 of the nitride film 12B is made from a silicon nitride film formed by a reaction of DCS based gas and $NH_3$ gas. The SiON film to be the structure transition layer 12B1 is made of DCS, $NH_3$, and $N_2O$.

First, the DCS based gas and the $N_2O$ gas are injected, and after several milliseconds to several minutes later, the $NH_3$ gas is also injected. Then, the flow of the $N_2O$ gas is reduced at a predetermined timing. Note that, if the refractive index is made stepwise, the flows of the $NH_3$ gas and the $N_2O$ gas may be changed stepwise.

Then, the bulk layer 12B2 of the nitride film 12 can be formed by using other gas base.

In the formation of the bulk layer 12B2 to be a main structure of the charge storage layer, $SiN_x$ is deposited of 1 to 15 nm by CVD method using monosilane ($SiH_4$), dichlorosilane ($SiCl_2H_2$), trichlorosilane ($SiCl_3H$), tetrachlorosilane ($SiCl_4$), or other gases containing silicon Si and gas containing a nitrogen atom such as N2 or $NH_3$.

As describe above, in the case where the bulk layer 12B2 of the nitride film 12B is made of silicon nitride $SiN_x$ (x>0), preferably, an upper region of the gate electrode 13 side is formed to include the Si—H bond having a density higher than the lower region of the substrate side. It is preferably for the charge retention that the center of the charge trap is far from the substrate.

In detail, in the formation of the $SiN_x$ film, for example, a layer near the substrate is treated by CVD at a condition in which a partial pressure ratio of $NH_3/SiCl_2H_2$ is small and then is treated at a condition in which a partial pressure ratio of $NH_3/SiCl_2H_2$ is large, which allows the region near the channel formation region to have a low density of Si—H bond and the second insulation film 12C side which is far from the channel formation region to have a high density thereof.

The Si—H bond has energy of approximately 3 eV which is relatively small, consequently, hydrogen causes an elimination reaction to form a Si dangling bond, namely, a density of hydrogen affects a distribution of the charge trap. Therefore, in $SiN_x$ formed in this way, the charge trap having a high density is easily formed at a far side from the formation region of the channel CH after the formation of the second insulation film 12C. Therefore, the charge once captured by the charge trap difficultly returns to the substrate side, so the charge retention characteristic is improved by that amount.

As other preferred methods of switching the CVD condition for achieving the similar effect, a layer near the substrate is deposited by CVD using mixed gas of $NH_3/SiCl_4$ in the formation of the $SiN_x$ film, after that, mixed gas is changed to $NH_3/SiCl_2H_2$, the layer is further deposited by CVD using the changed gas. Due to this method, the number of the Si—H bond is made small at the region near the channel formation region and made large at the region far from the channel formation region, consequently, the charge retention characteristic is improved.

The MONOS type memory transistor 10 is produced by using such methods, so it was learned that a data rewrite characteristic, the data retention characteristic, a program, a read disturb characteristic, and other reliabilities are improved.

Specifically, in the data retention characteristic, the guarantee for 10 years at 150° C. was achieved.

(Modification)

The present embodiments according to the present invention are not limited to the above description and can be modified in various ways.

The present invention can be applied to any of the case where a so-called MONOS type, MNOS type, or other silicon nitride based insulation film is used as the charge storage layer, the case where an insulation film having a lot of charge traps other than the silicon nitride base is used as the charge storage layer, or the case where an insulation material embedded with a fine polysilicon such as so-called nano-crystal type or a metal particle is used as the charge retention material.

In the case where the charge retention part is configured by small particle conductive material made of polysilicon or metal, as the charge storage layer, for example, a small particle conductive material formed and dispersed on the bottom insulation film and an insulation film buried with spaces between the small particle conductive materials or a nitride film formed on the insulation film are formed. In this case, a standard value for the evaluation parameter of the film quality for the nitride film is defined corresponding to any of the first to the third embodiments. Namely, the Si—H bond density of not more than $1 \times 10^{21}$ cm$^{-3}$, a range of the refractive index or the extinction coefficient (or absorption coefficient) so as to achieve the above bond density, the peak energy of the luminance spectrum of not more than 2.5 eV, the peak wavelength of the luminance spectrum of not less than 500 nm, or the peak energy of the luminance spectrum of not more than 2.5 eV is set as a reference, the nitride film is formed under the reference.

For example, if a fine crystal of $Si_xGe_{1-x}$ is formed as the small particle conductive material, by using monosilane ($SiH_4$), dichlorosilane ($SiCl_2H_2$), trichlorosilane ($SiCl_3H$), tetrachlorosilane ($SiCl_4$), or other gas containing silicon added german ($GeH_4$) for adding germanium as a material gas, CVD is performed, for example, at a substrate temperature of 650° C. Then, when the CVD is stopped in a stage of an island-shaped growth caused in an initial process of a crystal growth, a plurality of the fine crystal $Si_xGe_{1-x}$ is formed and dispersed on the bottom insulation film BTM. After that, for example, a silicon oxide film is deposited by CVD, and, on this film, a silicon nitride film having a film quality satisfying the reference set in the above is formed by a formation method satisfying the reference.

According to the present embodiment, the standard of the evaluation parameter of the film quality for the nitride film described in the first to fourth embodiments, namely, the Si—H bond density of the nitride film 12B, the refractive index or the extinction coefficient (or the absorption coefficient) in the vicinity of the ultraviolet absorption edge, the optical energy band, the peak wavelength of the luminance spectrum, or the peak energy thereof is applied. As a result, in the injection applying the maximum voltage of not more than 6 V, the retained charge in the nitride film is difficulty diffused when the injected charge is retained at high temperature for long time. Therefore, the writing operation and the erase operation of data are reliably performed by injecting charges (for example, holes) having an opposed polarity to the retained charge (for example, electrons). And, after that, if the charge is retained at high temperature for a long time, the threshold voltage is not changed (reduced) by a neutralization of electron and hole.

Note that, the maximum voltage of not more than 6 V is an indicator for achieving the charge injection in which the threshold voltage changes difficulty in an existing device. A bias voltage may be set so as to satisfy a standard that the gate voltage Vg is under the drain voltage Vd as a more general condition. In this condition, the impact ionization occurs sufficiently, and the injection of the charge can be performed more efficiency. Or, the bias voltage may be set so as to satisfy a standard that a voltage subtracted lower threshold voltage (for example, the threshold voltage in the erase state) Vth1 in two threshold voltage defining a storing state of bit data from the gate voltage Vg is under the drain voltage Vd. "(Vg−Vth1)=Vd" defines a pinchoff condition. Namely, when the drain voltage Vd is made the same as the pinchoff condition or larger than the same, an electric field of the drain of a horizontal direction may become relatively high and a ratio of the impact ionization may be sharply increased. Therefore, the reduction of the gate voltage Vg is preferably performed at least up to satisfying "(Vg−Vth1)≦Vd".

As described above, due to an application of the present invention, the memory transistor in which the data retention characteristic is hardly reduced and the reliability is high can be achieved.

Additionally, as described in the fifth embodiment, the structure transition layer 12B1 may be inserted between the first insulation film 12A and the bulk layer 12B2 of the nitride film 12B to optimize the evaluation parameter of the film quality for the nitride film. As a result, the data retention for 10 years at 150° C. is possible and high reliability is achieved. Further, the nonvolatile memory using the hot electron injection at low voltage of not more than 6 V for the writing operation or the erasing operation of data, and low costed MONOS nonvolatile memory using the same can be achieved easier.

The present invention is applicable to a nonvolatile memory device including a nitride film in a plurality of insulation films between a semiconductor region formed with a channel and a gate electrode, an IC product used with the same, a variety of electric device used the memory device or the IC product.

It should be understood by those skilled in the art that various modifications, combinations, sub-combinations and alterations may occur depending on design requirements and other factors in so far as they are within scope of the appeared claims or the equivalents thereof.

What is claimed is:

1. A nonvolatile memory device comprised of an array of memory transistors, each memory transistor having two source•drain regions formed in a semiconductor substrate and a plurality of insulation films including a nitride film for retaining charges inside and stacked between a gate electrode and a channel region formed in said semiconductor substrate between said two source•drain regions, and wherein a charge-store state of the memory transistor is changed by injecting hot carriers (high energy charges) into a local area of the nitride film at one or both of the source•drain regions side, wherein
   a density of a bond group of silicon and hydrogen (Si—H bond) of the nitride film is not more than $1 \times 10^{21}$ cm$^{-3}$; and further wherein the nitride film comprises
   a bulk layer of a nitride film, and
   a structure transition layer having a chemical composition between a chemical composition of the bulk layer of the nitride film and a chemical composition of a bottom insulation film formed under the bulk layer and over the channel and having a Si—H bond density lower than that of the bulk layer of the nitride film and the chemical composition of the structure transition layer chances gradually from a chemical composition which is relatively close to that of the bottom insulation film to a chemical composition which is relatively close to that of the bulk layer of the nitride film.

2. A nonvolatile memory device as set forth in claim 1, wherein a density of Si—H bond of the nitride film is $1 \times 10^{20}$ cm$^{-3}$ to $1 \times 10^{21}$ cm$^{-3}$.

3. A nonvolatile memory device as set forth in claim 1, further comprising:
   a voltage applying circuit for applying a plurality of voltages including a gate voltage to a gate electrode of each memory transistor and a drain voltage to the drain region of each memory transistor so as to inject the hot carriers (high energy charges), the voltages satisfying any of three voltage conditions including: a maximum voltage is not more than 6 V, the gate voltage applied to the gate electrode is not more than a voltage difference applied between the two source•drain regions as a result of the applied drain voltage, and a difference of voltage between the gate voltage and a lower threshold voltage of two threshold voltages defining data within the nitride film is not more than the drain voltage.

4. The nonvolatile memory device according to claim 3, wherein the voltage applying circuit for applying the plurality of voltages including a gate voltage to the gate electrode of each memory transistor and the drain voltage to the drain region of each memory transistor so as to inject the hot carriers (high energy charges), in which the maximum voltage applied for any of the plurality of voltages is not more than 6 V.

5. A nonvolatile memory device as set forth in claim 1, wherein, in the nitride film, an extinction coefficient which is an imaginary part of a complex refractive index in an ultraviolet region at a wavelength of 240 nm is not more than 0.10, or an extinction coefficient which is an imaginary part of a complex refractive index in an ultraviolet region at a wavelength of 230 nm is not more than 0.14.

6. A nonvolatile memory device as set forth in claim 1, wherein the structure transition layer has a discrete multilayered structure, each multi-layer having a different chemical composition, and wherein a bottommost layer thereof has a chemical composition which is relatively close to that of the bottom insulation film, and a topmost layer thereof has a chemical composition which is relatively close to that of the bulk layer of the nitride film.

7. A nonvolatile memory device as set forth in claim 1, wherein the structure transition layer has silicon oxynitride $SiO_xN_y$ (x, y>0) as a major component thereof.

8. A nonvolatile memory device as set forth in claim 1, wherein the extinction coefficient of the structure transition layer is smaller than that of the bulk layer of the nitride film.

9. A nonvolatile memory device as set forth in claim 1, wherein a refractive index of the structure transition layer is smaller than that of the bulk layer of the nitride film.

10. The nonvolatile memory device according to claim 1, wherein a pocket region is formed in the channel area of the semiconductor and is doped with an impurity opposite the impurity of said source•drain regions.

11. The nonvolatile memory device according to claim 1, wherein corresponding source drain extension regions extending from the respective source•drain regions towards the channel region are formed below the gate electrode in a vertical direction but formed in a lateral direction so as to overlap the gate electrode when viewed in plan, the source•drain extension regions being doped with a same impurity as the source•drain regions but to a lower concentration than the source•drain regions.

12. A nonvolatile memory device comprised of an array of memory transistors, each memory transistor having two source•drain regions formed in a semiconductor substrate and a plurality of insulation films including a nitride film for retaining charges inside thereof and stacked between a gate electrode and a channel region formed in said semiconductor substrate between said two source drain regions, and wherein a charge-store state of the memory transistor is changed by injecting hot carriers (high energy charges) into a local area of the nitride film at one or both of the source•drain region side, wherein
   in the nitride film, an extinction coefficient, which is an imaginary part of a complex refractive index in an ultraviolet region at a wavelength of 240 nm, is not more than 0.10, or an extinction coefficient, which is an imaginary part of a complex refractive index in an ultraviolet region at a wavelength of 230 nm, is not more than 0.14; and wherein the nitride film comprises
   a bulk layer of a nitride film, and
   a structure transition layer having a chemical composition between a chemical composition of the bulk layer of the nitride film and a chemical composition of a bottom insulation film formed under the bulk layer and over the channel and having a Si—H bond density lower than that of the bulk layer of the nitride film and the chemical composition of the structure transition layer changes gradually from a chemical composition which is relatively close to that of the bottom insulation film to a chemical composition which is relatively close to that of the bulk layer of the nitride film.

13. A nonvolatile memory device as set forth in claim 12, further comprising:
   a voltage applying circuit for applying a plurality of voltages including a gate voltage to a gate electrode of each memory transistor and a drain voltage to the drain region of each memory transistor so as to inject the hot carriers (high energy charges), the voltages satisfying any of three voltage conditions including: a maximum voltage is not more than 6 V, the gate voltage applied to the gate electrode is not more than a voltage difference applied between the two source•drain regions as a result of the applied drain voltage, and a difference of voltage between the gate voltage and a lower threshold voltage of two threshold voltages defining data within the nitride film is not more than the drain voltage.

14. A nonvolatile memory device as set forth in claim 12, wherein the structure transition layer has a discrete multilayered structure, each multi-layer having a different chemical composition, and wherein a bottommost layer thereof has a chemical composition which is relatively close to that of the bottom insulation film, and a topmost layer thereof has a chemical composition which is relatively close to that of the bulk layer of the nitride film.

15. A nonvolatile memory device as set forth in claim 12, wherein the structure transition layer has silicon oxynitride $SiO_xN_y$ (x, y>0) as a major component thereof.

16. A nonvolatile memory device as set forth in claim 12, wherein the extinction coefficient of the structure transition layer is smaller than that of the bulk layer of the nitride film.

17. A nonvolatile memory device as set forth in claim 12, wherein a refractive index of the structure transition layer is smaller than that of the bulk layer of the nitride film.

* * * * *